United States Patent
Choi

(10) Patent No.: US 12,369,470 B2
(45) Date of Patent: Jul. 22, 2025

(54) DISPLAY DEVICE AND ROLLABLE ELECTRONIC DEVICE

(71) Applicant: Samsung Display Co., Ltd., Yongin-si (KR)

(72) Inventor: Ji Woong Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/531,455

(22) Filed: Dec. 6, 2023

(65) Prior Publication Data

US 2024/0373695 A1    Nov. 7, 2024

(30) Foreign Application Priority Data

May 3, 2023  (KR) .................. 10-2023-0057519

(51) Int. Cl.
*H10K 59/131* (2023.01)
*G06F 1/16* (2006.01)
*H10K 102/00* (2023.01)

(52) U.S. Cl.
CPC ......... *H10K 59/131* (2023.02); *G06F 1/1652* (2013.01); *G06F 1/1656* (2013.01); *H10K 2102/311* (2023.02)

(58) Field of Classification Search
CPC ...... G06F 1/1652; H10K 59/131–1315; H10K 59/82; H10K 59/87; H10K 59/127; H10K 2102/311; H10K 77/111; H10K 50/80; H10K 77/10

See application file for complete search history.

(56) References Cited

U.S. PATENT DOCUMENTS

| | | | |
|---|---|---|---|
| 2018/0136371 A1* | 5/2018 | Kim | ............... B32B 7/12 |
| 2020/0203642 A1* | 6/2020 | Kim | ............. B32B 15/18 |
| 2021/0091163 A1* | 3/2021 | Son | ............. H01L 27/1225 |

FOREIGN PATENT DOCUMENTS

| | | | | |
|---|---|---|---|---|
| CN | 112130385 A | | 12/2020 | |
| KR | 20160107026 A | * | 9/2016 | ............. G06F 1/163 |
| KR | 10-2021-0124122 A | | 10/2021 | |
| KR | 10-2022-0019825 A | | 2/2022 | |
| KR | 10-2434865 B1 | | 8/2022 | |
| WO | WO-2021147714 A1 | * | 7/2021 | ........... G06F 1/1616 |

OTHER PUBLICATIONS

Rho_English, rho translation (Year: 2016).*

* cited by examiner

*Primary Examiner* — Minsun O Harvey
*Assistant Examiner* — Alexander Ehrlich
(74) *Attorney, Agent, or Firm* — Womble Bond Dickinson (US) LLP

(57) ABSTRACT

A display device includes: a display panel including: a substrate; a light-emitting layer on a first surface of the substrate; and wire pads on the first surface of the substrate, and adjacent to a side of the substrate; and a support member on a second surface of the substrate opposite to the first surface of the substrate. The substrate includes stepped portions protruding from the second surface in a thickness direction of the substrate, and the stepped portions overlap with the wire pads.

17 Claims, 20 Drawing Sheets

100: US, BS
110: ETC, NETC

DISPLAY DEVICE AND ROLLABLE ELECTRONIC DEVICE

CROSS-REFERENCE TO RELATED APPLICATION

The present application claims priority to and the benefit of Korean Patent Application No. 10-2023-0057519, filed on May 3, 2023, in the Korean Intellectual Property Office, the entire disclosure of which is incorporated by reference herein.

BACKGROUND

1. Field

Aspects of embodiments of the present disclosure relate to a display device and a rollable electronic device.

2. Description of Related Art

With the advancement of multimedia, the importance of display devices has increased. As such, various kinds of display devices, such as liquid crystal displays (LCDs) and organic light-emitting diode (OLED) displays, are being used. These display devices have diverse applications, for example, such as in mobile electronic devices and portable electronic devices, for example, such as smartphones, smartwatches, and tablet personal computers (PCs).

In recent years, there have been developments in display-related technologies. Instead of using rigid glass substrates, flexible materials such as plastics have been employed, or extremely thin and bendable glass substrates have been utilized. These advancements have led to the development of flexible display devices that can exhibit paper-like flexibility. Such flexible display devices can be further classified into two categories, bendable display devices that can be bent without breaking, and foldable display devices that can be folded. Additionally, researchers have been exploring the concept of rollable display devices that can be rolled around and/or unrolled from a roller, in order to meet growing demands for flexible display solutions.

The above information disclosed in this Background section is for enhancement of understanding of the background of the present disclosure, and therefore, it may contain information that does not constitute prior art.

SUMMARY

One or more embodiments of the present disclosure are directed to a display device and a rollable electronic device that may reduce or minimize damage to a substrate during a bonding process by including stepped portions located on a bonding portion of the substrate.

One or more embodiments of the present disclosure are directed to a display device and a rollable electronic device that may be optimized for a lamination process using a roller by reducing or minimizing a step between bonded members.

However, the aspects and features of the present disclosure are not restricted to those set forth above. The above and other aspects and features of the present disclosure will become more apparent to those having ordinary skill in the art from the description below, by referencing the detailed description and the drawings of the present disclosure, and/or by practicing one or more of the presented embodiments of the present disclosure.

According to one or more embodiments of the present disclosure, a display device includes: a display panel including: a substrate; a light-emitting layer on a first surface of the substrate; and wire pads on the first surface of the substrate, and adjacent to a side of the substrate; and a support member on a second surface of the substrate opposite to the first surface of the substrate. The substrate includes stepped portions protruding from the second surface in a thickness direction of the substrate, and the stepped portions overlap with the wire pads.

In an embodiment, the substrate may further include a bottom surface portion on the entirety of the second surface except for the stepped portions; and the bottom surface portion may not overlap with the wire pads.

In an embodiment, a thickness of the bottom surface portion may be less than a thickness of the stepped portions.

In an embodiment, the bottom surface portion may be an etched part of the substrate.

In an embodiment, the support member may include: a main portion overlapping with the light-emitting layer; and protrusion portions protruding from the main portion in a direction toward the stepped portions of the substrate.

In an embodiment, the stepped portions may include a plurality of stepped portions; the protrusion portions may include a plurality of protrusion portions; and the plurality of stepped portions and the plurality of protrusion portions may be alternately located.

In an embodiment, the substrate may further include a bottom surface portion on the entirety of the second surface except for the stepped portions; and the bottom surface portion may overlap with the protrusion portions of the support member.

In an embodiment, a sum of thicknesses of the bottom surface portion and the support member may be greater than or the same as a thickness of the stepped portions.

In an embodiment, the support member may have a larger size than that of the display panel in an extension direction of the protrusion portions.

In an embodiment, a length of the protrusion portions may be greater than a length of the stepped portions in the extension direction of the protrusion portions.

In an embodiment, the support member may further include a lower end portion below the main portion and the protrusion portions; and the lower end portion may overlap with the stepped portions and a bottom surface portion.

In an embodiment, a bottom surface of the lower end portion may be flat.

In an embodiment, sides of the main portion may be spaced from sides of the stepped portions.

In an embodiment, the support member may include a metal plate.

In an embodiment, the display device may further include: connection films on the wire pads; and driver chips on the connection films.

In an embodiment, the stepped portions may overlap with the connection films.

In an embodiment, the stepped portions may include a plurality of stepped portions; and the plurality of stepped portions may be spaced from one another.

According to one or more embodiments of the present disclosure, a rollable electronic device includes: a display device including: a display panel including: a substrate; a light-emitting layer on one surface of the substrate; and wire pads on the one surface of the substrate, and adjacent to one side of the substrate; and a support member on one surface of the display panel; and a housing having an inner space in which the display device is configured to be wound or unwound. The substrate includes stepped portions protruding in a direction toward the support member, the support member includes protrusion portions protruding in a direction toward the stepped portions, and the stepped portions and the protrusion portions are alternately located.

In an embodiment, the substrate may further include a bottom surface portion on the entirety of another surface of the substrate except for the stepped portions; and a sum of thicknesses of the bottom surface portion and the support member may be greater than or the same as a thickness of the stepped portions.

In an embodiment, a length of the protrusion portions may be greater than a length of the stepped portions in an extension direction of the protrusion portions.

According to one or more embodiments of the present disclosure, because stepped portions may be provided on a bonding portion of a substrate, damage to the substrate may be minimized or reduced during a bonding process.

According to one or more embodiments of the present disclosure, because a step between bonded members may be minimized or reduced, a display device and a rollable electronic device that may be optimized for a lamination process using a roller may be provided.

However, the aspects and features of the present disclosure are not limited to those described above, and other aspects and features of the present disclosure will become more apparent from the following description with reference to the drawings.

BRIEF DESCRIPTION OF THE DRAWINGS

The above and other aspects and features of the present disclosure will be more clearly understood from the following detailed description of embodiments with reference to the accompanying drawings, in which.

DETAILED DESCRIPTION

Figure 1:
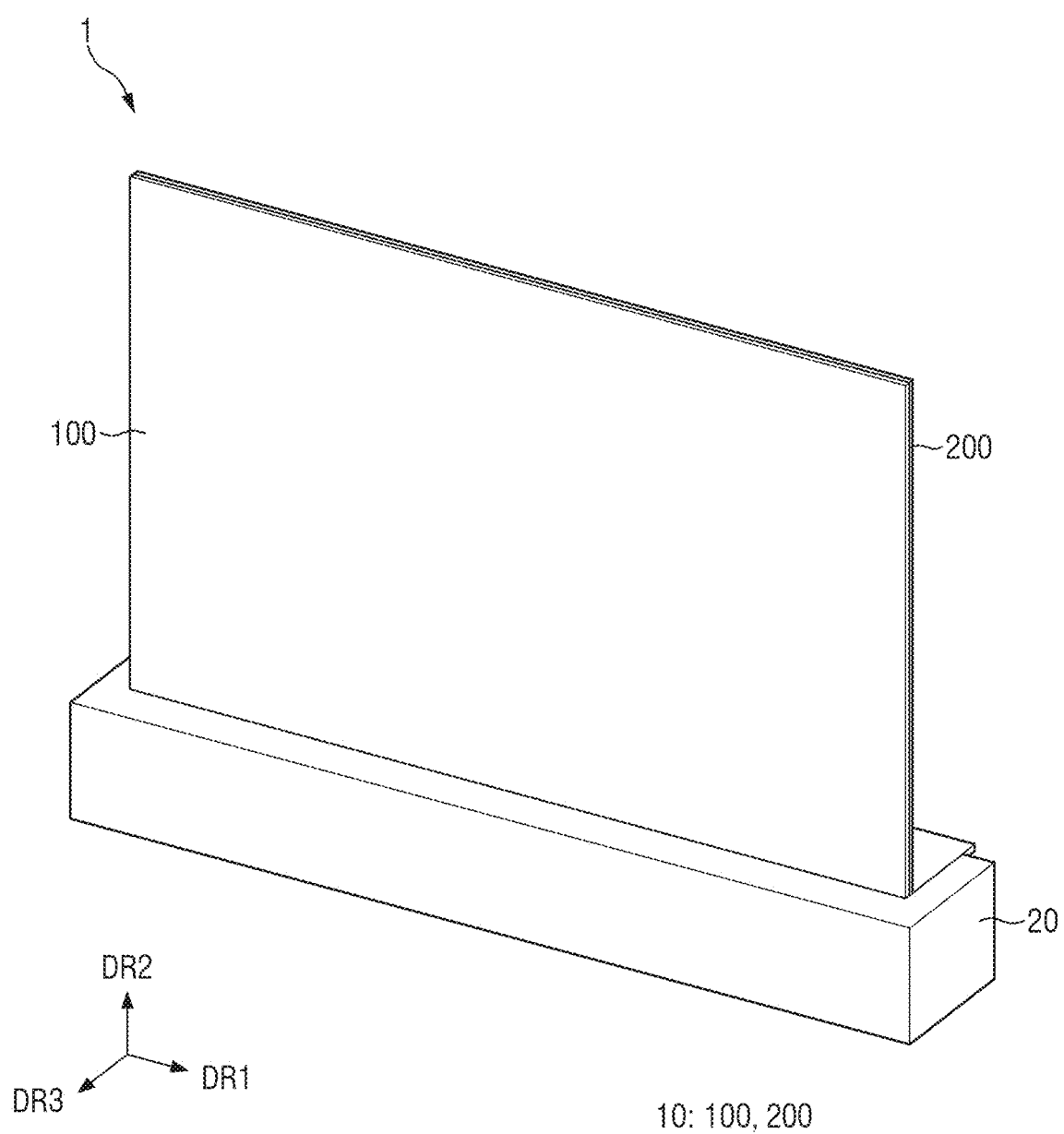
FIG. 1 is a perspective view of an electronic device according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
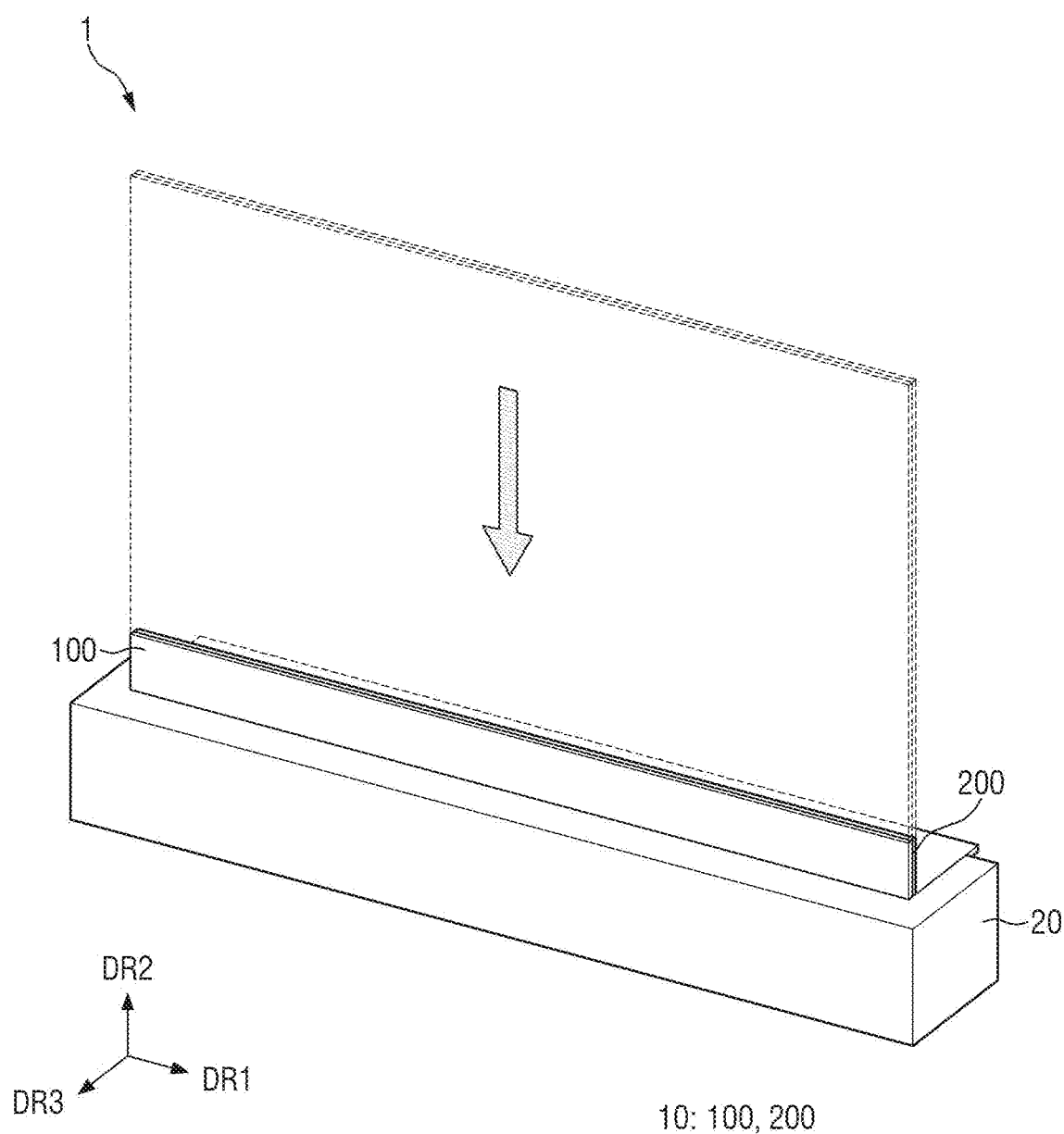
FIG. 2 is a perspective view illustrating an insertion of the electronic device of FIG. 1 into a housing.

FIG. 1 is a perspective view of an electronic device according to an embodiment of the present disclosure. FIG. 2 is a perspective view illustrating an insertion of the electronic device of FIG. 1 into a housing.

Referring to FIGS. 1 and 2, the electronic device 1 may be a rollable electronic device that can be at least partially rolled into and/or unrolled out of the housing 20, but the present disclosure is not limited thereto.

The electronic device 1 may include a display device 10, the housing 20, and a roller.

The display device 10 encompasses any suitable display device that provides a display screen for displaying videos or still images. For example, the display device 10 may include televisions (TVs), laptops, monitors, billboards, Internet of Things (IoT) devices, mobile phones, smartphones, tablet personal computers (PCs), electronic clocks, smartwatches, watch phones, head-mounted displays (HMDs), mobile communication terminals, electronic notepads, e-book readers, portable multimedia players (PMPs), navigation devices, game consoles, digital cameras, camcorders, and the like. The display device 10 may display images in a thickness direction (e.g., the third direction DR3).

In FIGS. 1 and 2, the first and second directions DR1 and DR2 cross or intersect each other. For example, the first and second directions DR1 and DR2 may be orthogonal to each other. The third direction DR3 crosses or intersects the first and second directions DR1 and DR2, and may represent a direction that is vertically orthogonal to the first and second directions DR1 and DR2. As used herein, the directions indicated by the arrows of the first, second, and third directions DR1, DR2, and DR3 may be referred to as one side or a first side of that direction, whereas an opposite direction may be referred to as the other side or a second side of that direction. However, the directions illustrated in the drawings are presented as examples, and thus, are relative directions without being limited to those illustrated or described above.

The shape of the display device 10 may be variously modified. For example, the display device 10 may have a rectangular shape that is elongated horizontally (e.g., in the first direction DR1), a rectangular shape that is elongated vertically (e.g., in the second direction DR2), a square shape, a tetragonal shape with rounded corners, another suitable polygonal shape, or a circular shape. FIGS. 1 and 2 illustrate that the display device 10 has a rectangular shape with a relatively longer length in the first direction DR1 as a representative example.

The display device 10 may be, for example, an inorganic light-emitting diode (LED) display device, an organic LED (OLED) display device, a quantum-dot LED display device, a plasma display device, or a field emission display (FED) device. The display device 10 may be described in more detail hereinafter in the context of an OLED display device as a representative example, but the present disclosure is not limited thereto.

The display device 10 may include a display panel 100 and a support member 200.

The display panel 100 may exhibit a flexibility and may be bendable. In some embodiments, the display panel 100 may be at least partially wrapped around the roller for installation within the housing 20. As the display panel 100 is elevated or lowered, the display panel 100 may be inserted into or ejected from the housing 20 through an opening of the housing 20 by winding the display panel 100 around the roller or unwinding the display panel 100 from the roller.

The support member 200 may be disposed on one side of the display panel 100. The support member 200 may be bonded to the one side of the display panel 100. The support member 200 may support the display panel 100, such that the display panel 100, which is flexible, may be able to maintain or substantially maintain its shape when ejected out of the housing 20.

In some embodiments, the support member 200 may include a metal plate having high rigidity. For example, the support member 200 may be formed of a metal or a metal alloy. The support member 200 may include copper (Cu), aluminum (Al), stainless steel (STS), and/or a suitable alloy thereof, but the present disclosure is not limited thereto.

The support member 200 may also exhibit a flexibility and may be bendable. The support member 200 may be at least partially wrapped around the roller for installation within the housing 20. As the support member 200 is elevated or lowered, the support member 200 may be inserted into or ejected from the housing 20 through the opening of the housing 20 by rolling or unrolling the support member 200 from the roller. In some embodiments, the support member 200 may have a mesh shape.

The housing 20 may include the opening through which the display device 10 is injected into or ejected from the housing 20, and an inner space for accommodating the display device 10 and the roller. The housing 20 may have a rectangular parallelepiped shape with the opening located at its top surface, but the present disclosure is not limited thereto.

The roller may be disposed within the housing 20. The roller may be configured as a cylindrical member, but the present disclosure is not limited thereto. The roller may roll or unroll the display device 10. As a result, as illustrated in FIG. 2, the display device 10 may be raised from or lowered into the housing 20.

Figure 3:
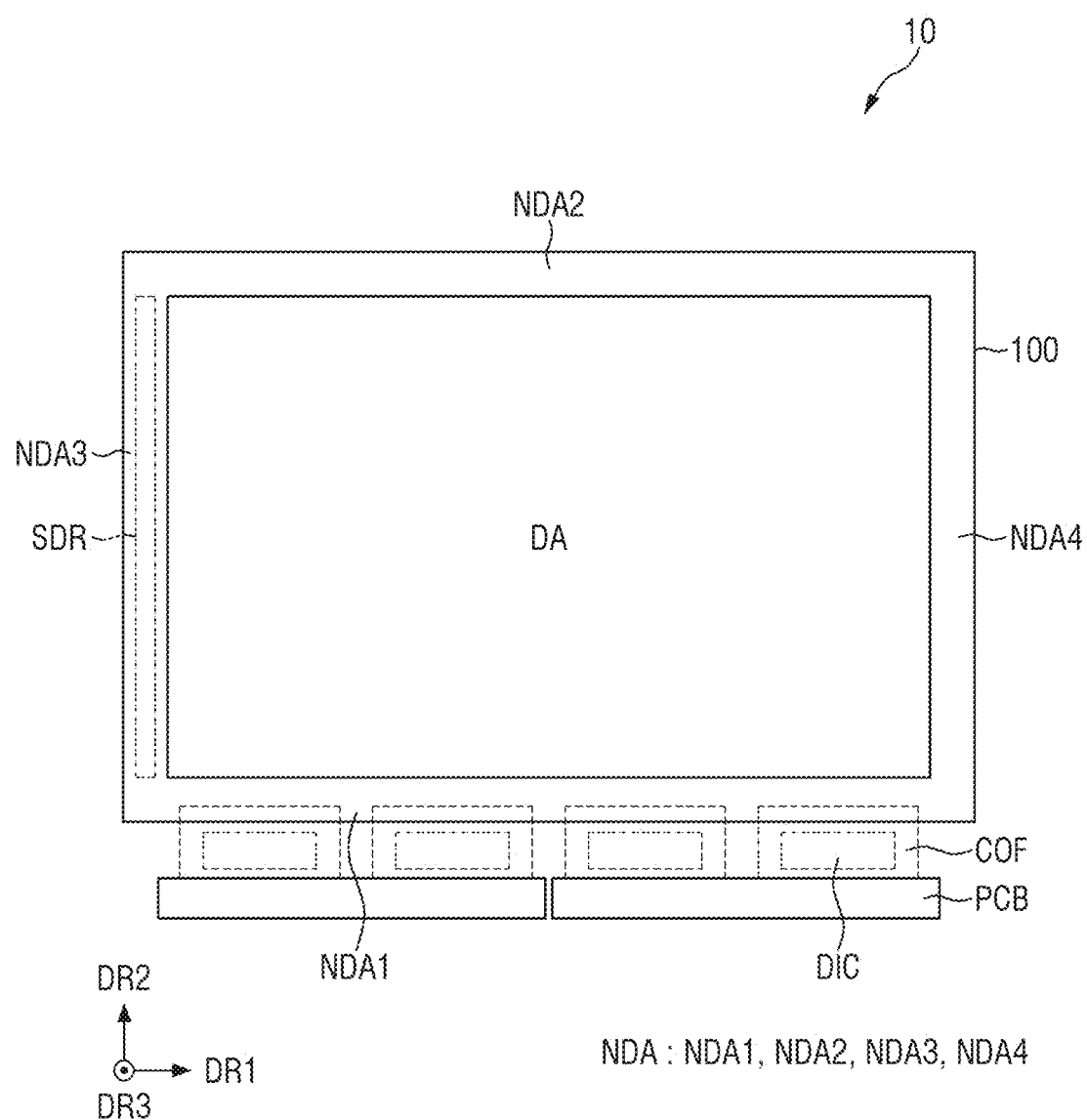
FIG. 3 is a plan view of a display device according to an embodiment of the present disclosure.

FIG. 3 is a plan view of a display device according to an embodiment of the present disclosure. For convenience of illustration, the support member 200 is not shown in FIG. 3.

Referring to FIG. 3, the display device 10 may include the display panel 100, connection films COF, driver chips DIC, and circuit boards PCB.

The display panel 100 may include a display area DA and a non-display area NDA. The display area DA may be an active area where an image is displayed. The display area DA may have a rectangular shape in a plan view, which may be similar to or the same as the overall shape of the display panel 100, but the present disclosure is not limited thereto.

The display area DA may include a plurality of pixels. The pixels may be arranged along row and column directions. The pixels may have a rectangular or square shape in a plan view, but the present disclosure is not limited thereto. As another example, the pixels may have a rhombus shape that is inclined with respect to the sides of the display panel 100. The pixels may include pixels of multiple colors. For example, the pixels may include, but are not limited to, first color pixels (e.g., red pixels), second color pixels (e.g., green pixels), and third color pixels (e.g., blue pixels). The first color pixels, the second color pixels, and the third color pixels may be arranged in a stripe pattern or an RGBG pattern (e.g., a PENTILE® pattern, PENTILE® being a duly registered trademark of Samsung Display Co., Ltd.).

The non-display area NDA may be disposed around (e.g., adjacent to) the display area DA. The non-display area NDA may completely or partially surround (e.g., around a periphery of) the display area DA. The display area DA may have a rectangular shape, and the non-display area NDA may be disposed around (e.g., adjacent to) four sides of the display area DA. The non-display area NDA may form a bezel of the display panel 100.

In the non-display area NDA, driver circuits or devices for driving the display area DA may be disposed. The non-display area NDA may include a first non-display area NDA1, a second non-display area NDA2, a third non-display area NDA3, and a fourth non-display area NDA4. In the first non-display area NDA1, which is disposed around (e.g., adjacent to) a first long side (e.g., the lower side in FIG. 3) of the display panel 100, a pad unit (e.g., a pad or pad area) may be provided on a display substrate of the display substrate 10, and external devices may be mounted on pad electrodes of the pad unit. As another example, external devices may also be mounted in the second non-display area NDA2, which is disposed around (e.g., adjacent to) a second long side (e.g., the upper side in FIG. 3) of the display panel 100. Examples of the external devices may include the connection films COF, the driver chips DIC, the circuit boards PCB, connectors, wire connection films, and the like.

In the third non-display area NDA3, which is disposed around (e.g., adjacent to) a first short side (e.g., the left side in FIG. 3) of the display panel 100, a scan driving unit (e.g., a scan driver or a scan driving circuit) SDR, which may be formed directly on the display substrate of the display panel 100, may be disposed. In the fourth non-display area NDA4, which is disposed around (e.g., adjacent to) a second short side (e.g., the right side in FIG. 3) of the display panel 100, another scan driving unit (e.g., another scan driver or scan driving circuit) SDR may also be disposed.

The connection films COF may be mounted in the non-display area NDA of the display panel 100. For example, the connection films COF may be mounted in the first non-display area NDA1 of the display panel 100, but the present disclosure is not limited thereto. The connection films COF may be films having wirings installed therein or thereon, and can accommodate integrated circuits (ICs), such as the driver chips DIC. The connection films COF may be flexible films.

The driver chips DIC may output signals and voltages for driving the display panel 100. The driver chips DIC may supply data voltages to data lines. The driver chips DIC may supply power supply voltages to power lines, and may apply gate control signals to a gate driving unit (e.g., a gate driver or a gate driving circuit).

The driver chips DIC may be formed as ICs, and may be mounted on the display panel 100 by a chip-on-glass (COG) method, a chip-on-plastic (COP) method, or ultrasonic bonding. For example, as illustrated in FIG. 3, the driver chips DIC may be mounted on the connection films COF in the COF method.

The circuit boards PCB may be mounted on the pad unit or the connection films COF of the display panel 100. Various ICs or external devices may be mounted on the circuit boards PCB. Lead lines of the circuit boards PCB may be electrically connected to the pad unit of the display panel 100.

The circuit boards PCB may be flexible films such as flexible printed circuit boards (FPCBs), printed circuit boards (PCBs), or chip-on films (COFs).

Figure 4:
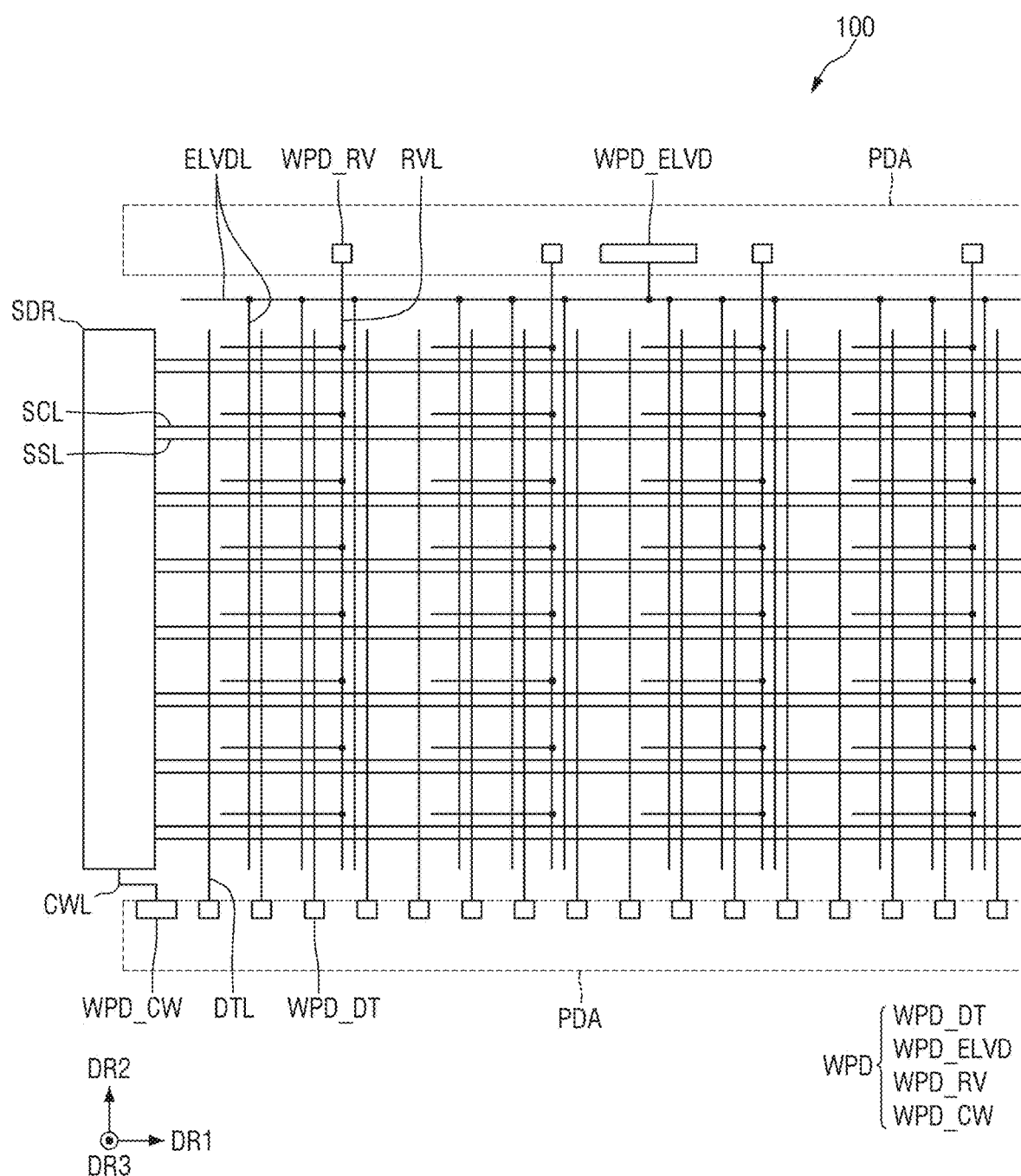
FIG. 4 is a plan view illustrating lines of a display panel of FIG. 3.

FIG. 4 is a plan view illustrating lines of the display panel of FIG. 3.

Referring to FIGS. 3 and 4, the display panel 100 may include a plurality of lines. The lines may include scan lines SCL, sensing signal lines SSL, data lines DTL, reference voltage lines RVL, and a first power line ELVDL.

The scan lines SCL and the sensing signal lines SSL may extend in the first direction DR1. The scan lines SCL and the sensing signal lines SSL may be connected to the scan driving unit SDR. The scan driving unit SDR may include driving circuitry, which is formed of a circuit layer (e.g., see CCL of FIG. 5). The scan driving unit SDR may be disposed in the third non-display area NDA3, but the present disclosure is not limited thereto. As another example, the scan driving unit SDR may be disposed in the fourth non-display area NDA4, or in both the third and fourth non-display areas NDA3 and NDA4. The scan driving unit SDR may be connected to a signal connecting line CWL, and at least one end of the signal connecting line CWL may form a pad WPD_CW in the first or second non-display area NDA1 or NDA2, and may be connected to the connection films COF.

The data lines DTL and the reference voltage lines RVL may extend in the second direction DR2, which crosses or intersects the first direction DR1. The first power supply line ELVDL may include parts extending in the second direction DR2.

The first power supply line ELVDL may further include parts extending in the first direction DR1. The first power supply line ELVDL may have a mesh structure, but the present disclosure is not limited thereto.

Wire pads WPD may be disposed at at least one end of each of the data lines DTL, the reference voltage lines RVL, and the first power supply line ELVDL. The wire pads WPD may be disposed in a pad area PDA of the non-display area NDA. Wire pads WPD_DT (hereinafter, data pads WPD_DT) of the data lines DTL may be disposed in the pad area PDA in the first non-display area NDA1. Wire pads WPD_RV (hereinafter, reference voltage pads WPD_RV) of the reference voltage lines RVL and a wire pad WPD_ELVD (hereinafter, a first power supply pad WPD_ELVD) of the first power supply line ELVDL may be disposed in the pad area PDA in the second non-display area NDA2. As another example, the data pads WPD_DT, the reference voltage pads WPD_RV, and the first power supply pad WPD_ELVD may be disposed in the same area as each other, for example, such as in the first non-display area NDA1. The connection films COF may be mounted on the wire pads WPD. The connection films COF may be mounted on the wire pads WPD via anisotropic conductive films (ACFs) or ultrasonic bonding.

Figure 5:
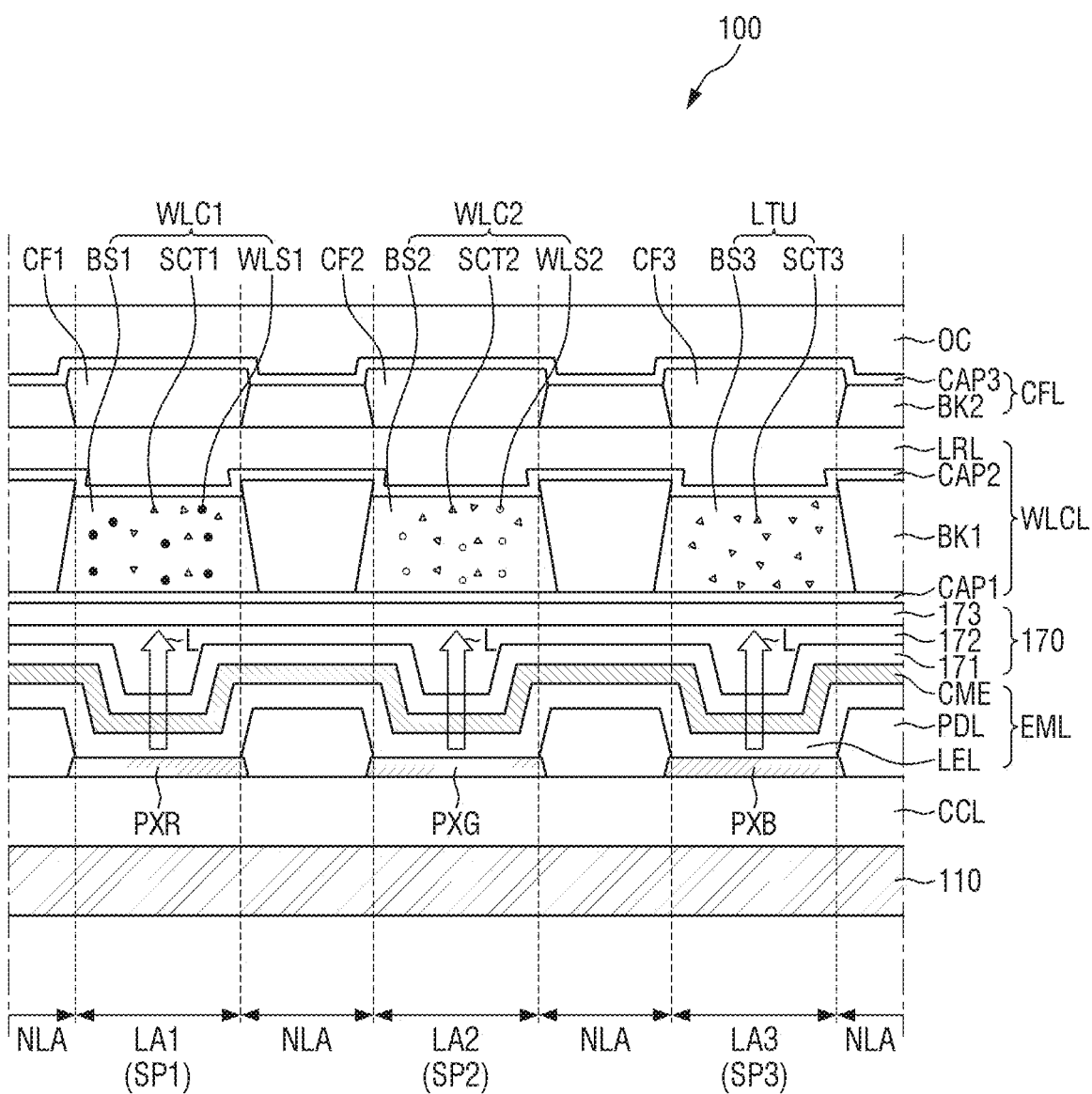
FIG. 5 is a cross-sectional view of a portion of the display panel of FIG. 3.

FIG. 5 is a cross-sectional view of a portion of the display panel of FIG. 3.

Referring to FIG. 5, the display panel 100 may include a substrate 110, the circuit layer CCL, a light-emitting element layer EML, an encapsulation structure 170, a wavelength conversion layer WLCL, a color filter layer CFL, and an overcoat layer OC.

The substrate 110 may include a transparent material. For example, the substrate 110 may include a transparent insulating material, such as glass or quartz. The substrate 110 may be a rigid substrate.

However, the present disclosure is not limited to this. As another example, the substrate 110 may include a plastic, such as polyimide, and may be flexible so as to be foldable, bendable, or rollable. For example, the substrate 110 may be formed of ultra-thin glass (UTG) having a thickness of about 500 μm. In this example, when the rollable display device 10 is rolled or unrolled, the substrate 110 may also undergo rolling or unrolling.

The shape of the substrate 110 will be described in more detail below with reference to FIG. 6.

The circuit layer CCL may be disposed on the substrate 110. The circuit layer CCL may include a data metal layer that forms thin-film transistors (TFTs), capacitors, and various wires or lines, and may also include interlayer insulating films and organic films. Various suitable designs may be applicable to the circuit layer CCL depending on the kind of the display panel 100. The layout of the wires or lines of the circuit layer CCL has been described above with reference to FIG. 4, and thus, redundant description thereof may not be repeated.

The light-emitting element layer EML may be disposed on the circuit layer CCL. The light-emitting element layer EML may include pixel electrodes PXE, a pixel-defining film PDL, a light-emitting layer LEL, and a common electrode CME.

The pixel electrodes PXE may be first electrodes (e.g., anodes) of LEDs. The pixel electrodes PXE may have a stacked film structure, in which a high work function material layer including or consisting of a material with a high work function, such as indium tin oxide (ITO), indium zinc oxide (IZO), zinc oxide (ZnO), or indium oxide ($In_2O_3$), and a reflective material layer including or consisting of a reflective material, such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a suitable mixture thereof, are stacked. The high work function material layer may be disposed above the reflective material layer, and in closer proximity to the light-emitting layer LEL. The pixel electrodes PXE may have a multilayered structure, such as ITO/Mg, ITO/MgF, ITO/Ag, or ITO/Ag/ITO, but the present disclosure is not limited thereto.

The pixel electrodes PXE may include first, second, and third pixel electrodes PXR, PXG, and PXB, which are disposed in first, second, and third pixels SP1, SP2, and SP3, respectively. The first pixel electrode PXR may overlap with a first light-emitting area LA1. The second pixel electrode PXG may overlap with a second light-emitting area LA2. The third pixel electrode PXB may overlap with a third light-emitting area LA3.

The pixel-defining film PDL may be disposed along boundaries of each pixel SP on one surface of the substrate 110. The pixel-defining film PDL may be disposed on the pixel electrodes PXE, and may include openings that expose the pixel electrodes PXE. The light-emitting areas LA and a non-light-emitting area NLA may be distinguished from each other by the pixel-defining film PDL and the openings of the pixel-defining film PDL.

The pixel-defining film PDL may include an organic insulating material, such as an acrylic resin, an epoxy resin, a phenolic resin, a polyamide resin, a polyimide resin, an unsaturated polyester resin, a polyphenylene ether resin, a polyphenylene sulfide resin, or benzocyclobutene (BCB). As another example, the pixel-defining film PDL may include an inorganic material.

The light-emitting layer LEL may be disposed on the pixel electrodes PXE exposed by the pixel-defining film PDL. The light-emitting layer LEL may be in contact with the pixel electrodes PXE, as well as with the sides and top surface of the pixel-defining film PDL. The light-emitting layer LEL may be connected continuously across the light-emitting areas LA and the pixels SP without any distinction. The light-emitting layer LEL may be disposed on the entire or substantially entire surface of the display panel 100 across the light-emitting areas LA and the pixels SP without any distinction. Accordingly, the wavelength of light emitted by the light-emitting layer LEL may be the same or substantially the same across the light-emitting areas LA. For example, the first, second, and third light-emitting areas LA1, LA2, and LA3 may all emit blue light or ultraviolet (UV) light, and the first, second, and third pixels SP1, SP2, and SP3 may be able to display their respective colors due to the presence of the wavelength conversion layer WLCL.

As another example, the light-emitting layer LEL may be disposed separately for each of the light-emitting areas LA, which are defined by the pixel-defining film PDL. In this case, the wavelength of light emitted by the light-emitting layer LEL may be the same or substantially the same across the light-emitting areas LA. As another example, in this case, the wavelength of light emitted by the light-emitting layer LEL may be different across different light-emitting areas LA.

In an embodiment, the display panel 100 is an OLED display panel, and the light-emitting layer LEL may include an organic layer that includes an organic material. The organic layer may include an organic light-emitting layer, and in some cases, may also include a hole injection layer, a hole transport layer, an electron transport layer, and/or an electron injection layer as auxiliary layers for assisting in the emission of light by the light-emitting layer LEL. As another example, in an embodiment, the display panel 100 is a micro-LED display panel or a nano-LED display panel, and the light-emitting layer LEL may include an inorganic material, such as an inorganic semiconductor.

In some embodiments, the light-emitting layer LEL may have a tandem structure including multiple organic light-emitting layers stacked on top of each other in the thickness direction, with charge generation layers disposed between the multiple organic light-emitting layers. The multiple organic light-emitting layers may emit light having the same or substantially the same wavelength as each other, or with different wavelengths from each other. At least some layers of the light-emitting layer LEL in each pixel SP may be separated from corresponding layers in neighboring pixels SP by the pixel-defining film PDL, or they may be connected to each other.

The common electrode CME may be disposed on the light-emitting layer LEL. The common electrode CME may be connected continuously across the light-emitting areas LA and the pixels SP without any distinction. The common electrode CME may be a full electrode disposed on the entire or substantially entire surface of the display panel 100, without differentiation between the light-emitting areas LA or the pixels SP. The common electrode CME may correspond to second electrodes (e.g., cathodes) of LEDs. The common electrode CME may include a low work function material layer including or consisting of a material with a low work function, such as Li, Ca, LiF/Ca, LiF/Al, Al, Mg, Ag, Pt, Pd, Ni, Au Nd, Ir, Cr, BaF, Ba, or a suitable compound or mixture thereof (e.g., a mixture of Ag and Mg). The common electrode CME may further include a transparent metal oxide layer on the low work function material layer.

The pixel electrodes PXE, the light-emitting layer LEL, and the common electrode CME may form light-emitting devices (e.g., organic light-emitting devices). The light emitted by the light-emitting layer LEL may be output in an upward direction through the common electrode CME.

The encapsulation structure 170 may be disposed on the common electrode CME. The encapsulation structure 170 may include at least one thin-film encapsulation layer. For example, the encapsulation structure 170 may include a first inorganic film 171, an organic film 172, and a second inorganic film 173.

The first inorganic film 171 may be disposed on the light-emitting element layer EML. The first inorganic film 171 may include silicon oxide ($SiN_x$), silicon oxide ($SiO_x$), or silicon oxynitride ($SiO_xN_y$).

The organic film 172 may be disposed on the first inorganic film 171. The organic film 172 may include an organic insulating material, such as an acrylic resin, an epoxy resin, a phenolic resin, a polyamide resin, a polyimide resin, an unsaturated polyester resin, a polyphenylene ether resin, a polyphenylene sulfide resin, or BCB.

The second inorganic film 173 may be disposed on the organic film 172. The second inorganic film 173 may include the same or substantially the same material as that of the first inorganic film 171. For example, the second inorganic film 173 may include $SiN_x$, $SiO_x$, or $SiO_xN_y$.

The wavelength conversion layer WLCL may be disposed on the encapsulation structure 170. The wavelength conversion layer WLCL may include a first capping layer CAP1, a first bank layer BK1, a first wavelength conversion portion WLC1, a second wavelength conversion portion WLC2, a light-transmitting portion LTU, a second capping layer CAP2, and a low-refractive-index layer LRL.

The first capping layer CAP1 may be disposed on the second inorganic film 173 of the encapsulation structure 170. The first capping layer CAP1 may seal the bottom surfaces of the first and second wavelength conversion portions WLC1 and WLC2 and the light-transmitting portion LTU. The first capping layer CAP1 may include an inorganic material. For example, the first capping layer CAP1 may include at least one of silicon nitride, aluminum nitride, zirconium nitride, titanium nitride, hafnium nitride, tantalum nitride, silicon oxide, aluminum oxide, titanium oxide, tin oxide, cerium oxide, and/or silicon oxynitride.

The first bank layer BK1 may be disposed in the non-light-emitting area NLA on the first capping layer CAP1. The first bank layer BK1 may overlap with the pixel-defining film PDL in the thickness direction. The first bank layer BK1 may block the transmission of light. The first bank layer BK1 may improve color reproduction by preventing or substantially preventing light intrusion and color mixing between the first, second, and third light-emitting areas LA1, LA2, and LA3. The first bank layer BK1 may be arranged in a grid pattern surrounding (e.g., around peripheries of) the first, second, and third light-emitting areas LA1, LA2, and LA3 in a plan view. The first bank layer BK1 may include a light-blocking material.

The first bank layer BK1 may separate the first wavelength conversion portion WLC1, the second wavelength conversion portion WLC2, and the light-transmitting portion LTU from one another, such that the first wavelength conversion portion WLC1, the second wavelength conversion portion WLC2, and the light-transmitting portion LTU correspond to the first, second, and third light-emitting areas LA1, LA2, and LA3, respectively.

The first wavelength conversion portion WLC1 may be disposed in the first light-emitting area LA1 on the first capping layer CAP1. The first wavelength conversion portion WLC1 may be surrounded (e.g., around a periphery thereof) by the first bank layer BK1. The first wavelength conversion portion WLC1 may include a first base resin BS1, a first scatterer SCT1, and a first wavelength shifter WLS1.

The first base resin BS1 may include a suitable material with a relatively high light transmittance. The first base resin BS1 may be formed of a transparent organic material. For example, the first base resin BS1 may include at least one organic materials from among an epoxy resin, an acrylic resin, a cardo resin, and/or an imide resin.

The first scatterer SCT1 may have a different refractive index from that of the first base resin BS1, and may form an optical interface with the first base resin BS1. For example, the first scatterer SCT1 may include a light-scattering material or light-scattering particles capable of scattering at least some of the transmitted light. For example, the first scatterer SCT1 may include particles of a metal oxide, such as titanium oxide ($TiO_2$), zirconium oxide ($ZrO_2$), aluminum oxide ($Al_xO_y$), $In_2O_3$, ZnO, or tin oxide ($SnO_2$), or particles of an organic material, such as an acrylic resin or a urethane resin. The first scatterer SCT1 may scatter incident light in random directions regardless of the incident direction of the incident light, without substantially altering the peak wavelength of the incident light.

The first wavelength shifter WLS1 may convert or shift the peak wavelength of the incident light into a first peak wavelength. For example, the first wavelength shifter WLS1 may convert blue light provided by the light-emitting layer LEL into red light having a single peak wavelength of 610 nm to 650 nm, and may emit the red light. The first wavelength shifter WLS1 may include quantum dots, quantum rods, or a phosphor. The quantum dots may be particle-like materials where electrons transition from the conduction band to the valence band, and thus, emitting light with specific or predetermined colors.

Some of the blue light provided by the light-emitting element layer EML may pass through the first wavelength shifter WLS1 without being converted into red light by the first wavelength conversion portion WLC1. The blue light emitted from the light-emitting element layer EML that is not converted by the first wavelength conversion portion WLC1 may be blocked by a first color filter CF1 when incident upon the first color filter CF1. Additionally, the red light converted by the first wavelength conversion portion WLC1 from the blue light provided by the light-emitting element layer EML may pass through the first color filter CF1 and be emitted externally. Therefore, the first light-emitting area LA1 may emit red light.

The second wavelength conversion portion WLC2 may be disposed in the second light-emitting area LA2 on the first capping layer CAP1. The second wavelength conversion portion WLC2 may be surrounded (e.g., around a periphery thereof) by the first bank layer BK1. The second wavelength conversion portion WLC2 may include a second base resin BS2, a second scatterer SCT2, and a second wavelength shifter WLS2.

The second base resin BS2 may include a suitable material with a relatively high light transmittance. The second base resin BS2 may be formed of a transparent organic material. For example, the second base resin BS2 may be formed of the same or substantially the same material as that of the first base resin BS1, or may include any one of the materials provided as examples above for the first base resin BS1.

The second scatterer SCT2 may have a different refractive index from that of the second base resin BS2, and may form an optical interface with the second base resin BS2. For example, the second scatterer SCT2 may include a light-scattering material or light-scattering particles capable of scattering at least some of the transmitted light. For example, the second scatterer SCT2 may be formed of the same or substantially the same material as that of the first scatterer SCT1, or may include any one of the materials provided as examples above for the first scatterer SCT1. The second scatterer SCT2 may scatter the incident light in random directions regardless of the incident direction of the incident light, without substantially altering the peak wavelength of the incident light.

The second wavelength shifter WLS2 may convert or shift the peak wavelength of the incident light into a second peak wavelength, which is different from the first peak wavelength. For example, the second wavelength shifter WLS2 may convert the blue light provided by the light-emitting layer LEL into green light having a single peak wavelength of 510 nm to 550 nm, and may emit the green light. The second wavelength shifter WLS2 may include quantum dots, quantum rods, or a phosphor. The second wavelength shifter WLS2 may include one or more of the materials provided as examples above for the first wavelength shifter WLS1. The second wavelength shifter WLS2 includes quantum dots, quantum rods, or a phosphor that exhibit a different wavelength conversion range from that of the first wavelength shifter WLS1.

The light-transmitting portion LTU may be disposed in the third light-emitting area LA3 on the first capping layer CAP1. The light-transmitting portion LTU may be surrounded (e.g., around a periphery thereof) by the first bank layer BK1. The light-transmitting portion LTU may transmit the incident light therethrough, while maintaining or substantially maintaining the peak wavelength of the incident light. The light-transmitting portion LTU may include a third base resin BS3 and a third scatterer SCT3.

The third base resin BS3 may include a suitable material with a relatively high light transmittance. The third base resin BS3 may be formed of a transparent organic material. For example, the third base resin BS3 may be formed of the same or substantially the same material as that of the first or second base resin BS1 or BS2, or may include any one of the materials provided as examples above for the first base resin BS1.

The third scatterer SCT3 may have a different refractive index from that of the third base resin BS3, and may form an optical interface with the third base resin BS3. For example, the third scatterer SCT3 may include a light-scattering material or light-scattering particles capable of scattering at least some of the transmitted light. For example, the third scatterer SCT3 may be formed of the same or substantially the same material as that of the first or second scatterer SCT1 or SCT2, or may include any one of the materials provided as examples above for the first scatterer SCT1. The third scatterer SCT3 may scatter the incident light in random directions regardless of the incident direction of the incident light, without substantially altering the peak wavelength of the incident light.

Because the wavelength conversion layer WLCL is disposed directly on the encapsulation structure 170, the display panel 100 may not need a separate substrate for accommodating the first and second wavelength conversion portions WLC1 and WLC2 and the light-transmitting portion LTU. Accordingly, the first wavelength conversion portion WLC1, the second wavelength conversion portion WLC2, and the light-transmitting portion LTU may be easily aligned within the first, second, and third light-emitting areas LA1, LA2, and LA3, respectively, and the thickness of the display panel 100 may be reduced.

The second capping layer CAP2 may cover the first and second wavelength conversion portions WLC1 and WLC2, the light-transmitting portion LTU, and the first bank layer BK1. For example, the second capping layer CAP2 may seal the first and second wavelength conversion portions WLC1 and WLC2 and the light-transmitting portion LTU, thereby preventing or substantially preventing the first and second wavelength conversion portions WLC1 and WLC2 and the light-transmitting portion LTU from being damaged or contaminated. The second capping layer CAP2 may be formed of the same or substantially the same material as that of the first capping layer CAP1, or may include any one of the materials provided as examples above for the first capping layer CAP1.

The low-refractive-index layer LRL, which is an optical layer for recycling light that passes through the first and second wavelength conversion portions WLC1 and WLC2 and the light-transmitting portion LTU, may improve light emission efficiency and color purity. The low-refractive-index layer LRL may be formed of an organic material having a low refractive index. The low-refractive-index layer LRL may compensate for a step formed by the first and second wavelength conversion portions WLC1 and WLC2, the light-transmitting portion LTU, and the first bank layer BK1.

In some embodiments, a capping layer may be additionally disposed between the low-refractive-index layer LRL and the color filter layer CFL.

The color filter layer CFL may include a second bank layer BK2, first, second, and third color filters CF1, CF2, and CF3, and a third capping layer CAP3.

The second bank layer BK2 may be disposed in the non-light-emitting area NLA on the low-refractive-index layer LRL of the wavelength conversion layer WLCL. The second bank layer BK2 may overlap with the pixel-defining film PDL and the first bank layer BK1 in the thickness direction. The second bank layer BK2 may block the transmission of light. The second bank layer BK2 may improve color reproduction by preventing or substantially preventing light intrusion and color mixing between the first, second, and third light-emitting areas LA1, LA2, and LA3. The second bank layer BK2 may be arranged in a grid pattern surrounding (e.g., around peripheries of) the first, second, and third light-emitting areas LA1, LA2, and LA3 in a plan view.

The first color filter CF1 may be disposed in the first light-emitting area LA1 on the low-refractive-index layer LRL. The first color filter CF1 may be surrounded (e.g., around a periphery thereof) by the second bank layer BK2. The first color filter CF1 may overlap with the first wavelength conversion portion WLC1 in the thickness direction. The first color filter CF1 may selectively transmit first-color light (e.g., red light) therethrough, and block or absorb second-color light (e.g., green light) and third-color light (e.g., blue light). For example, the first color filter CF1 may be a red color filter, and may include a red colorant. The red colorant may include or consist of a red dye or a red pigment.

The second color filter CF2 may be disposed in the second light-emitting area LA2 on the low-refractive-index layer LRL. The second color filter CF2 may be surrounded (e.g., around a periphery thereof) by the second bank layer BK2. The second color filter CF2 may overlap with the second wavelength conversion portion WLC2 in the thickness direction. The second color filter CF2 may selectively transmit the second-color light therethrough, and block or absorb the first-color light and the third-color light. For example, the second color filter CF2 may be a green color filter, and may include a green colorant. The green colorant may include or consist of a green dye or a green pigment.

The third color filter CF3 may be disposed in the third light-emitting area LA3 on the low-refractive-index layer LRL. The third color filter CF3 may be surrounded (e.g., around a periphery thereof) by the second bank layer BK2. The third color filter CF3 may overlap with the third wavelength conversion portion WLC3 in the thickness direction. The third color filter CF3 may selectively transmit the third-color light therethrough, and block or absorb the first-color light and the second-color light. For example, the third color filter CF3 may be a blue color filter, and may include a blue colorant. The blue colorant may include or consist of a blue dye or a blue pigment.

The first, second, and third color filters CF1, CF2, and CF3 may reduce the reflection of external light from the outside of the display panel 100 by absorbing a portion of the incident external light. Accordingly, the first, second, and third color filters CF1, CF2, and CF3 help prevent or substantially prevent color distortion that could arise from reflected external light.

As the first, second, and third color filters CF1, CF2, and CF3 are disposed directly on the low-refractive-index layer LRL of the wavelength conversion layer WLCL, the display panel 100 may not need a separate substrate for accommodating the first, second, and third color filters CF1, CF2, and CF3. Accordingly, the thickness of the display panel 100 may be reduced.

The third capping layer CAP3 may cover the first, second, and third color filters CF1, CF2, and CF3. The third capping layer CAP3 may protect the first, second, and third color filters CF1, CF2, and CF3. The third capping layer CAP3 may be formed of the same or substantially the same material as that of the first capping layer CAP1, or may include any one of the materials provided as examples above for the first capping layer CAP1.

The overcoat layer OC may be disposed on the third capping layer CAP3 of the color filter layer CFL. The overcoat layer OC may be disposed across the entire or substantially entire display area DA, and may also be disposed in part of the non-display area NDA. The overcoat layer OC may include an organic insulating material, and may protect the members disposed in the display area DA from the outside.

Figure 6:
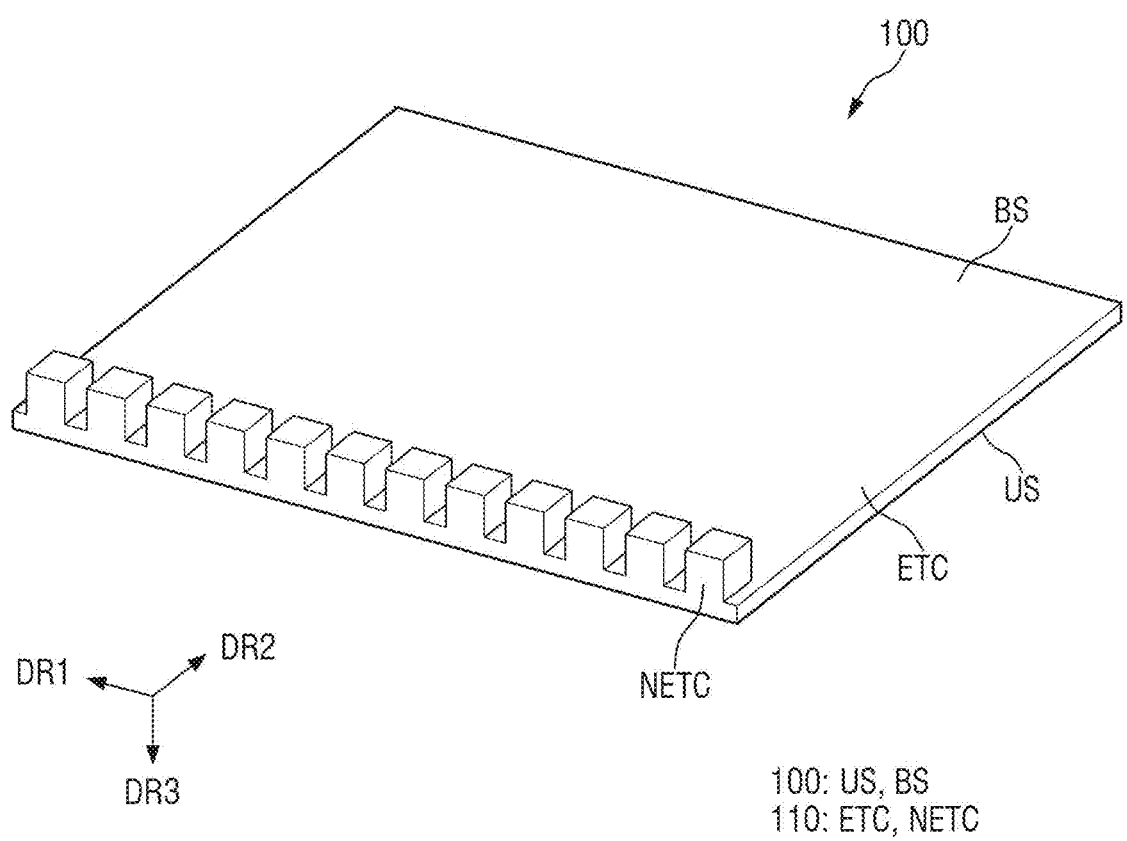
FIG. 6 is a perspective view of the bottom surface of a substrate of the display panel of FIG. 3.
Figure 7:
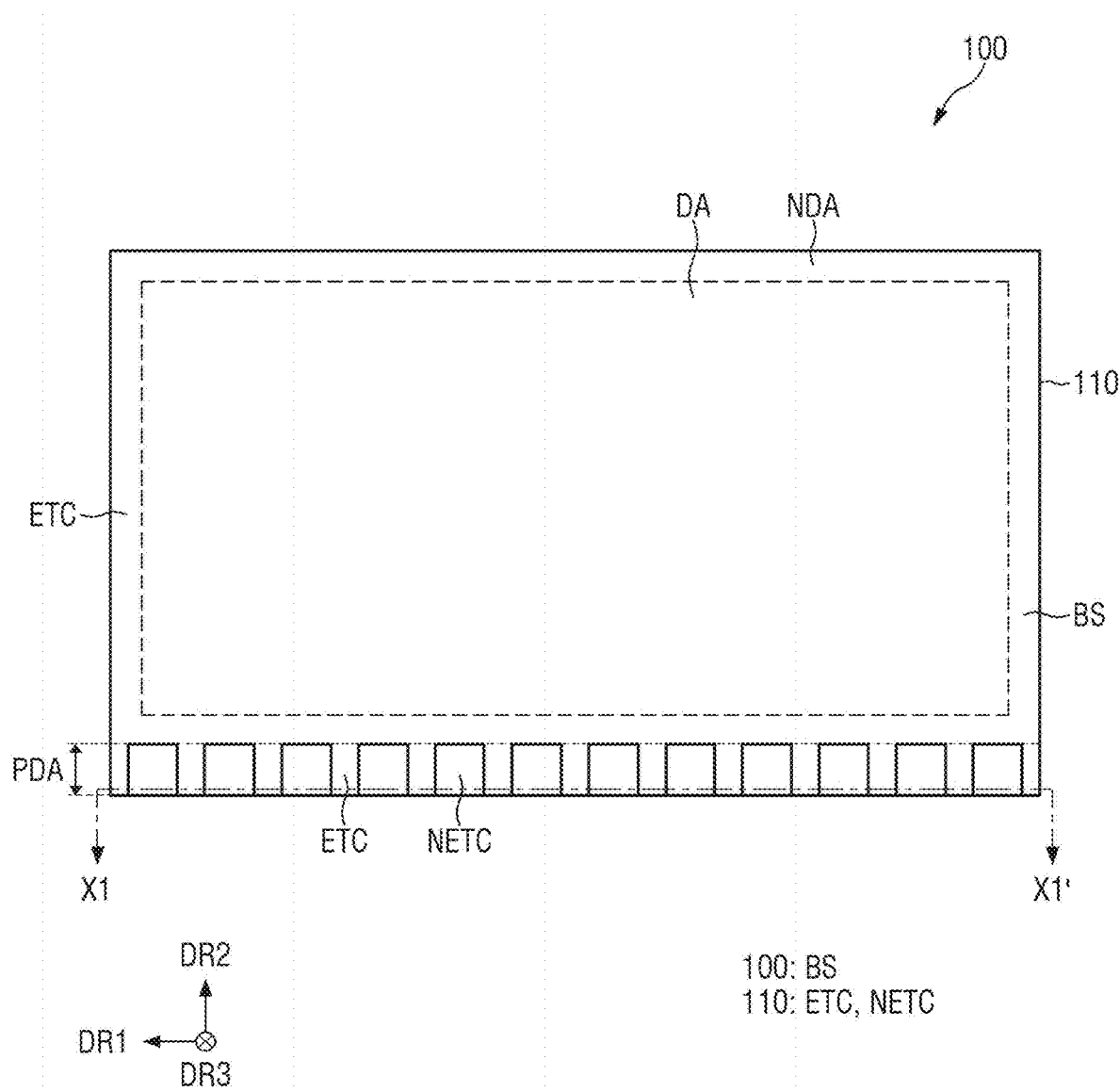
FIG. 7 is a plan view illustrating the bottom surface of the substrate of the display panel of FIG. 3.
Figure 8:
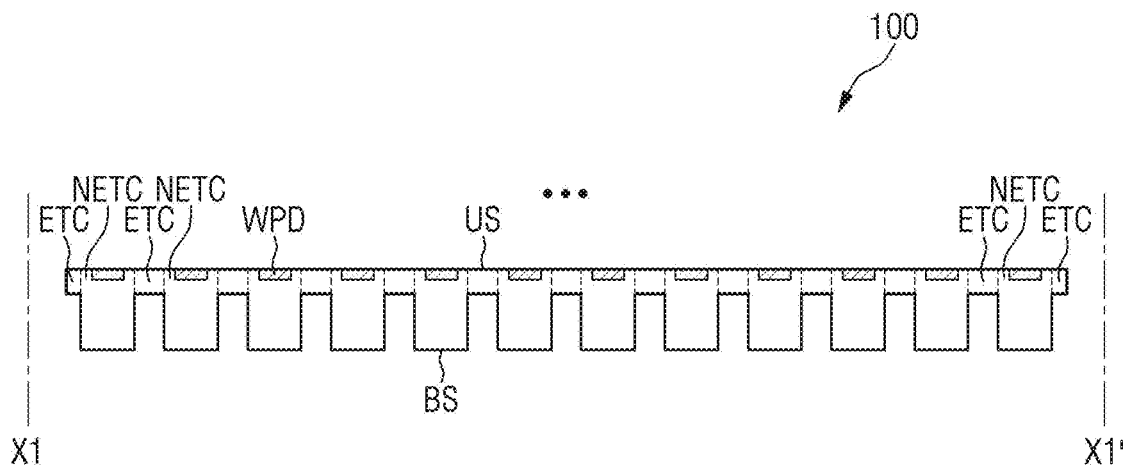
FIG. 8 is a cross-sectional view taken along the line X1-X1' of FIG. 7.

FIG. 6 is a perspective view of the bottom surface of a substrate of the display panel of FIG. 3. FIG. 7 is a plan view illustrating the bottom surface of the substrate of the display panel of FIG. 3. FIG. 8 is a cross-sectional view taken along the line X1-X1' of FIG. 7.

Referring to FIGS. 6 through 8 and FIGS. 1 through 4, the substrate 110 of the display panel 100 may include a bottom surface portion ETC and stepped portions NETC, which are disposed on the bottom surface BS of the substrate 110.

The bottom surface portion ETC may overlap with the display area DA, the non-display area NDA, and the pad area PDA in the third direction DR3. The bottom surface portion ETC may be thinner than the stepped portions NETC. For example, the bottom surface portion ETC may have a thickness (e.g., in the third direction DR3) of about 100 μm. The bottom surface portion ETC may be an etched portion obtained by partially etching the substrate 110. The bottom surface portion ETC may not overlap with the wire pads WPD, which are disposed near the top surface US of the substrate 110.

Because the bottom surface portion ETC is thinner than the stepped portions NETC, the display panel 100 can be flexibly rolled when the display device 10 is rolled into or unrolled from the housing 20.

The stepped portions NETC may overlap with the pad area PDA in the third direction DR3. The stepped portions NETC may be thicker than the bottom surface portion ETC. For example, the stepped portions NETC may have a thickness (e.g., in the third direction DR3) of about 500 μm. The stepped portions NETC may be non-etched portions of the substrate 110. The stepped portions NETC may overlap with the wire pads WPD.

The stepped portions NETC may be bonding portions for mounting the connection films COF on the wire pads WPD. Because the stepped portions NETC are thicker than the bottom surface portion ETC, the substrate 110 may be prevented or substantially prevented from being damaged by high temperature and high pressure during the bonding of the connection films COF.

Multiple stepped portions NETC may be formed. The stepped portions NETC may be spaced apart from one another in the first direction DR1. The bottom surface portion ETC may be positioned between the stepped portions NETC.

Figure 9:
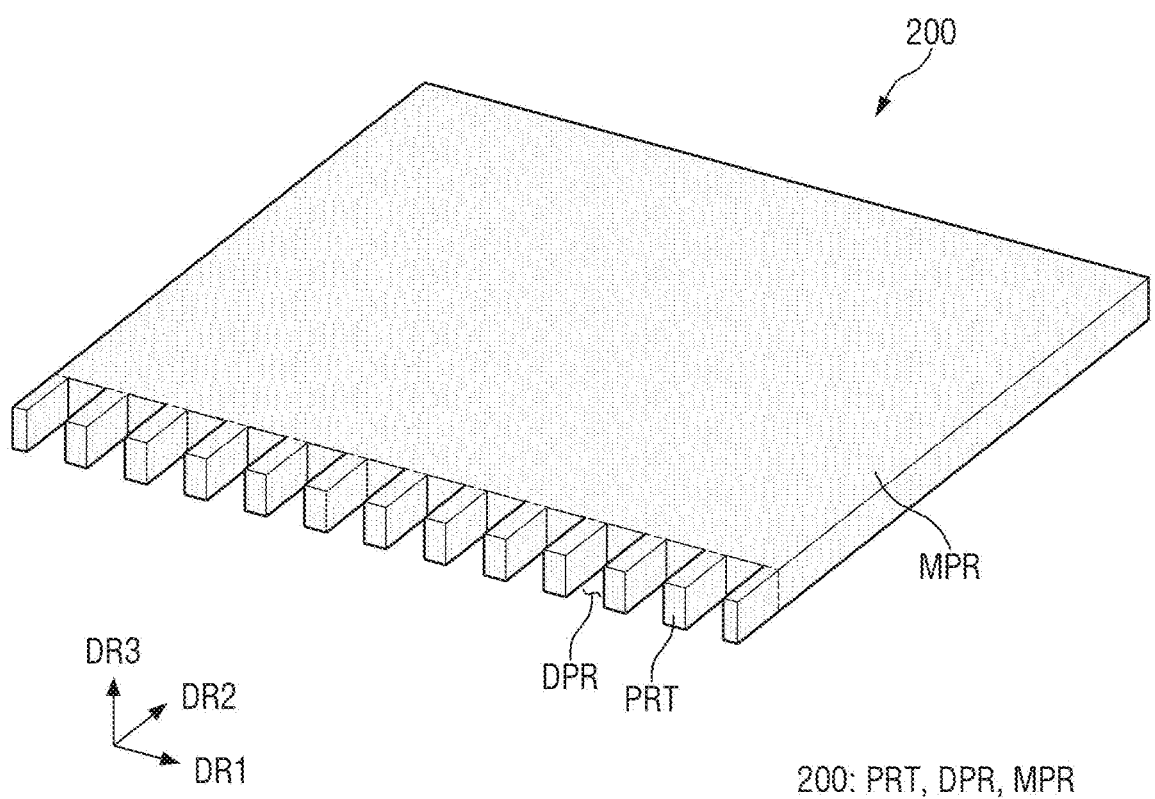
FIG. 9 is a perspective view of a support member according to an embodiment of the present disclosure.
Figure 10:
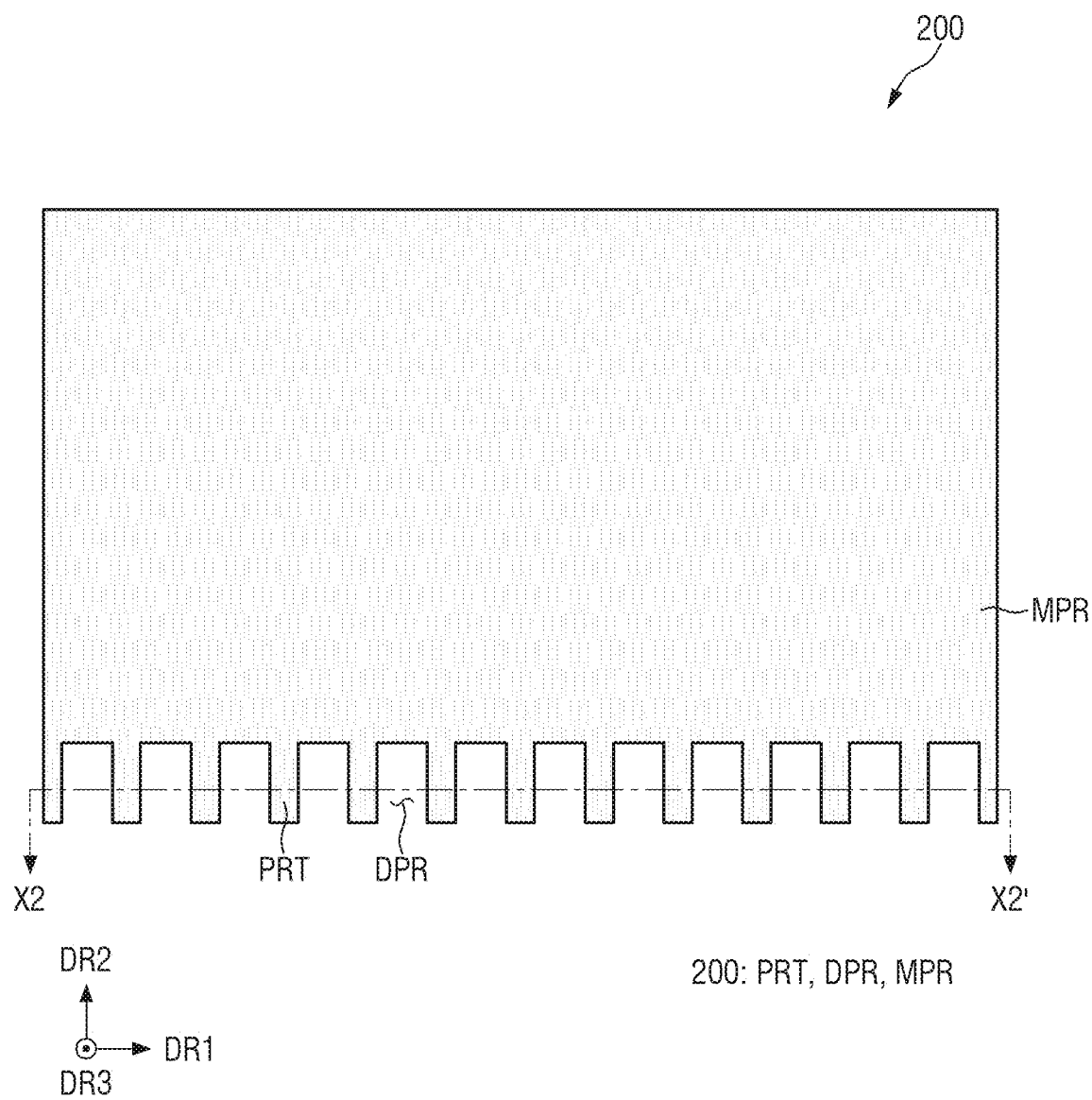
FIG. 10 is a plan view illustrating the front surface of the support member of FIG. 9.
Figure 11:
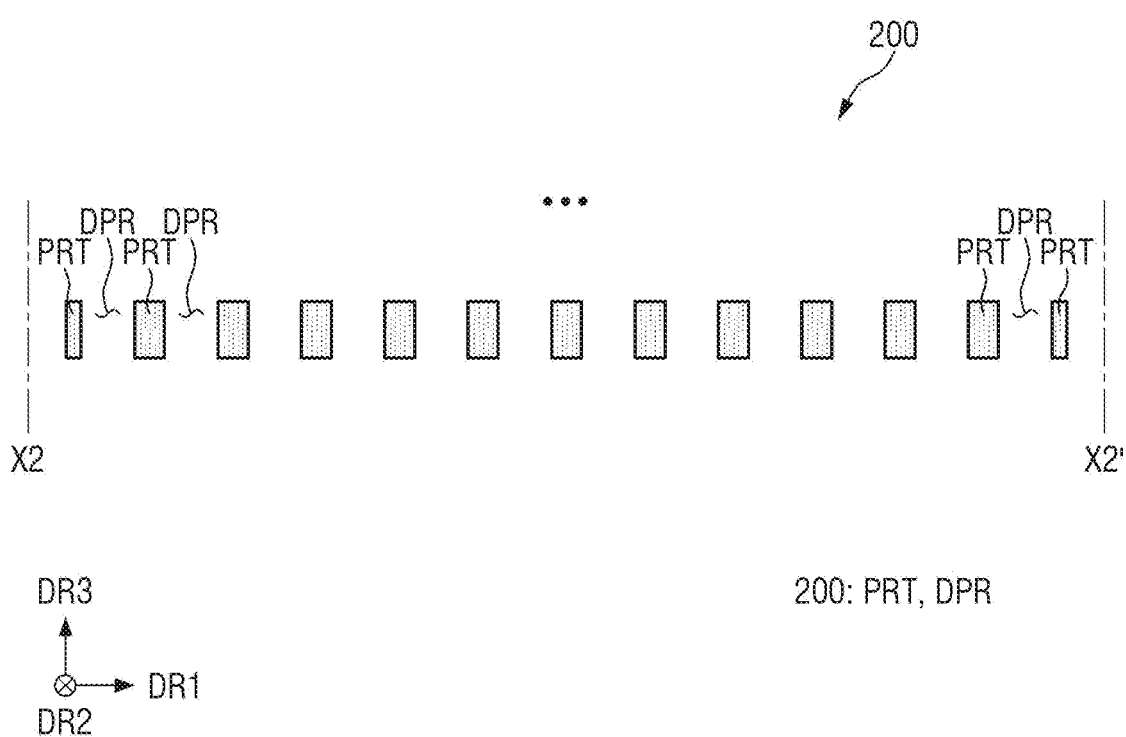
FIG. 11 is a cross-sectional view taken along the line X2-X2' of FIG. 10.

FIG. 9 is a perspective view of a support member according to an embodiment of the present disclosure. FIG. 10 is a plan view illustrating the front surface of the support member of FIG. 9. FIG. 11 is a cross-sectional view taken along the line X2-X2' of FIG. 10.

Referring to FIGS. 9 through 11 and FIGS. 1 through 4, the support member 200 may include a main portion MPR, protrusion portions PRT, and depression portions DPR.

The main portion MPR may overlap with the display area DA and the non-display area NDA in the third direction DR3. The shape of the main portion MPR may correspond to the shapes of the display area DA and the non-display area NDA.

The protrusion portions PRT may protrude from the main portion MPR. For example, the protrusion portions PRT may protrude in the opposite direction of the second direction DR2 from the main portion MPR. The protrusion portions PRT may overlap with the pad area PDA in the third direction DR3. Multiple protrusion portions PRT may be formed. The protrusion portions PRT may be spaced apart from one another in the first direction DR1.

The depression portions DPR may be disposed on one side of the main portion MPR. For example, the depression portions DPR may be positioned on a side of the main portion MPR in the opposite direction of the second direction DR2. The depression portions DPR may be disposed between the protrusion portions PRT. Multiple depression portions DPR may be formed. The depression portions DPR may be spaced apart from one another in the first direction DR1, and may be disposed between the protrusion portions PRT.

Figure 12:
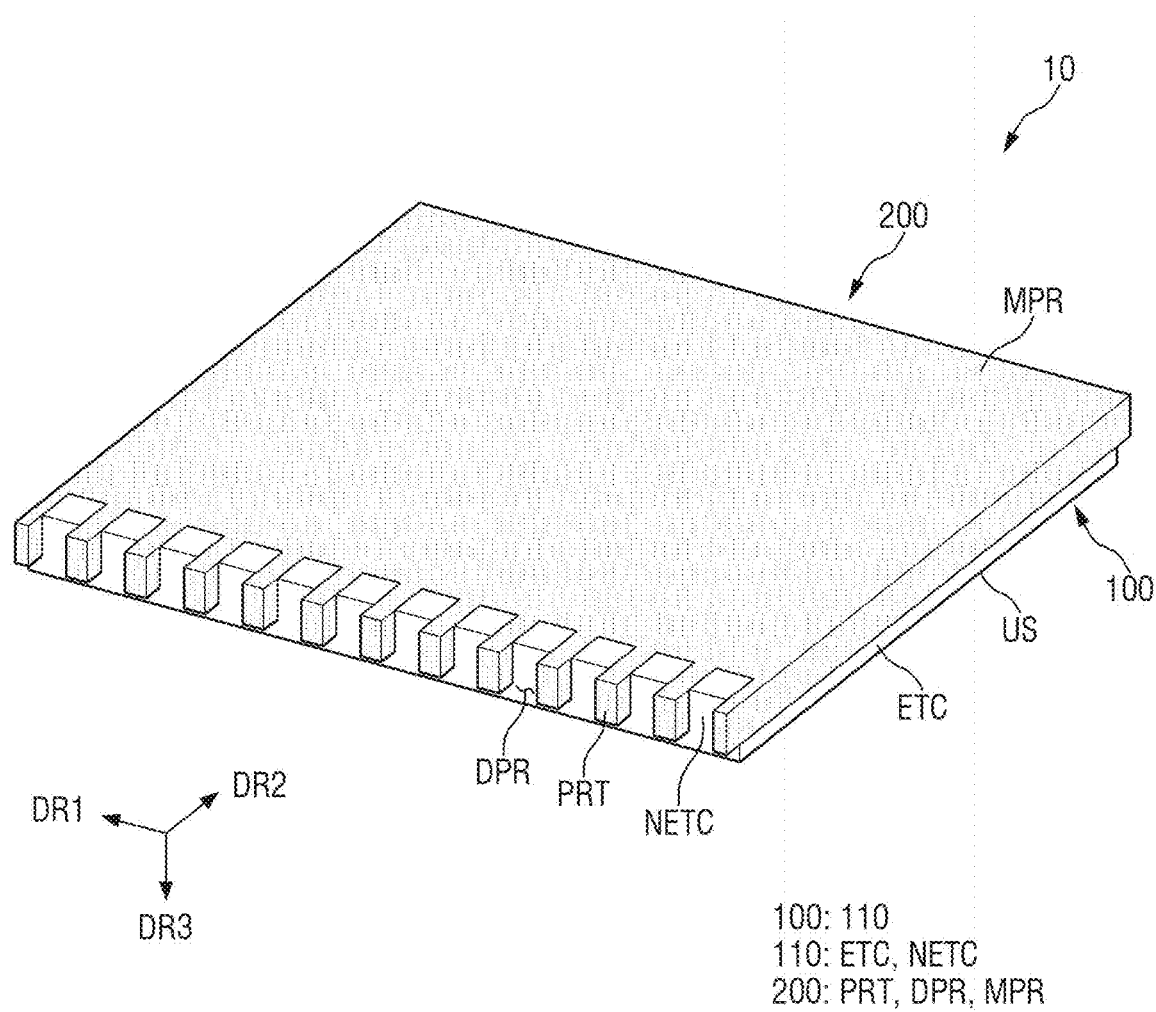
FIG. 12 is a perspective view illustrating a bonded state of the substrate of the display panel of FIG. 3 and the support member of FIG. 9.

FIG. 12 is a perspective view illustrating a bonded state of the substrate of the display panel of FIG. 3 and the support member of FIG. 9.

Referring to FIG. 12 and FIGS. 6 through 11, the support member 200 may be bonded onto the bottom surface BS of the display panel 100. The support member 200 may include a suitable material having high rigidity and high flexibility. Thus, when the display panel 100 is ejected from the housing 20, the support member 200 may support the display panel 100 to maintain or substantially maintain its shape. When the display panel 100 is inserted into the housing 20, the support member 200 may also be rolled and inserted into the housing 20 together with the display panel 100.

The support member 200 may compensate for the step formed by the stepped portions NETC of the substrate 110, and may level the entire display device 10. For example, the stepped portions NECT of the substrate 110 may be inserted into the depression portions DPR of the support member 200. When the display panel 100 and the support member 200 are bonded together, the stepped portions NETC of the substrate 110 and the protrusion portions PRT of the support member 200 may be alternately arranged. The thickness of the support member 200 may be the same or substantially the same as the thickness of the stepped portions NETC of the substrate 110 to compensate for the step formed by the stepped portions NETC of the substrate 110.

The display device 10 may include the stepped portions NETC, which may prevent or substantially prevent damage to the substrate 110 during the bonding of the external devices, such as the connection films COF. Because the display device 10 includes the protrusion portions PRT and the depression portions DPR in the support member 200, the step formed by the stepped portions NETC may be compensated for and leveled. Consequently, a roll-based lamination process, such as roll-to-roll and roll-to-stage kinds of processes, may be employed to bond the display panel 100 and the support member 200 to each other, which may lead to enhanced process efficiency and yield.

The support member 200 may have a larger size than that of the display panel 100 in a plan view. Accordingly, a space for accommodating a coupling portion for coupling the external devices may be additionally secured.

The compensation of the step and the securing of the coupling space by the support member 200 will be described in more detail hereinafter with reference to FIGS. 13 through 16.

Figure 13:
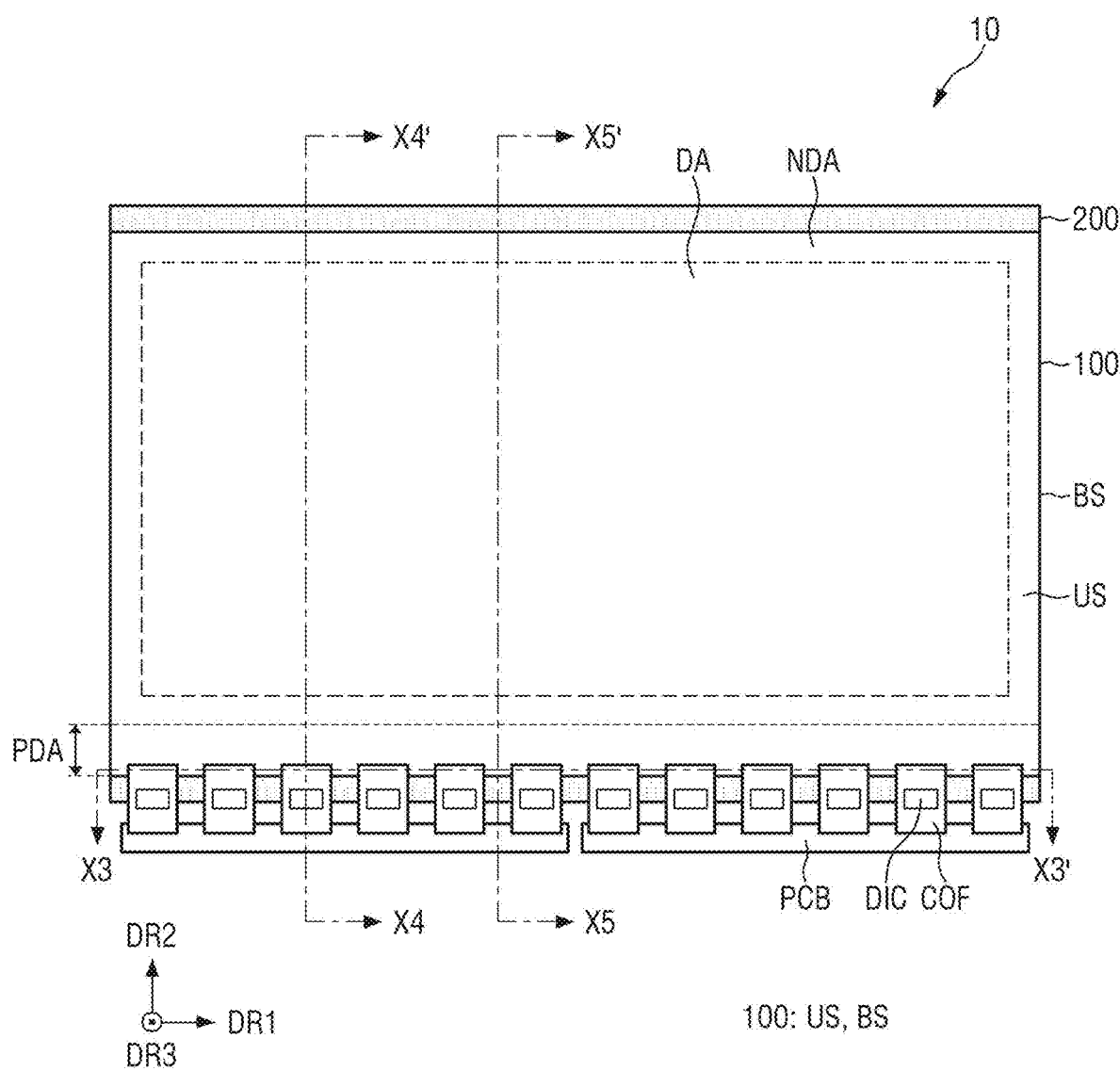
FIG. 13 is a plan view of a display device according to an embodiment of the present disclosure.
Figure 14:
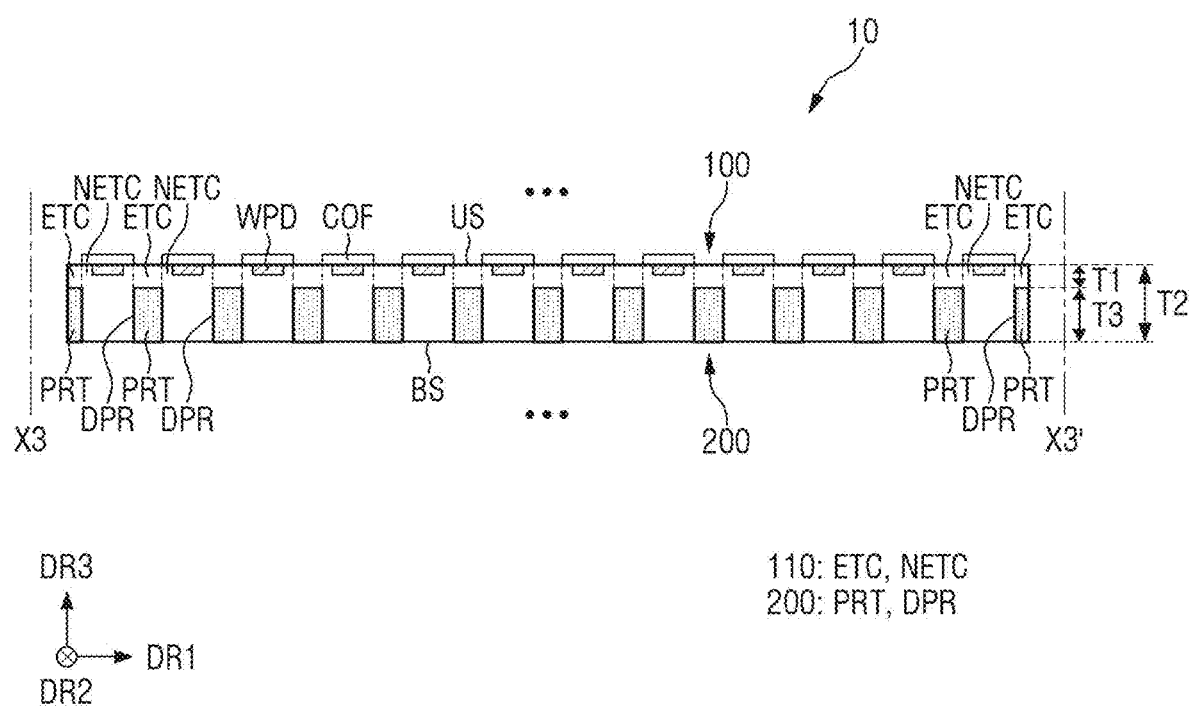
FIG. 14 is a cross-sectional view taken along the line X3-X3' of FIG. 13.
Figure 15:
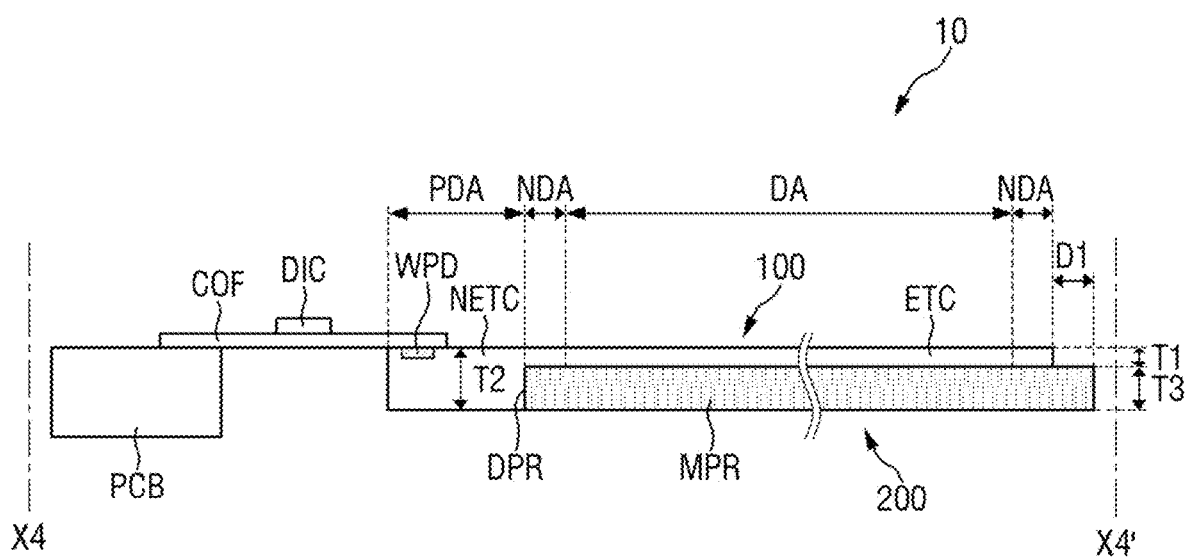
FIG. 15 is a cross-sectional view taken along the line X4-X4' of FIG. 13.
Figure 15:
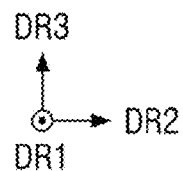
Figure 16:
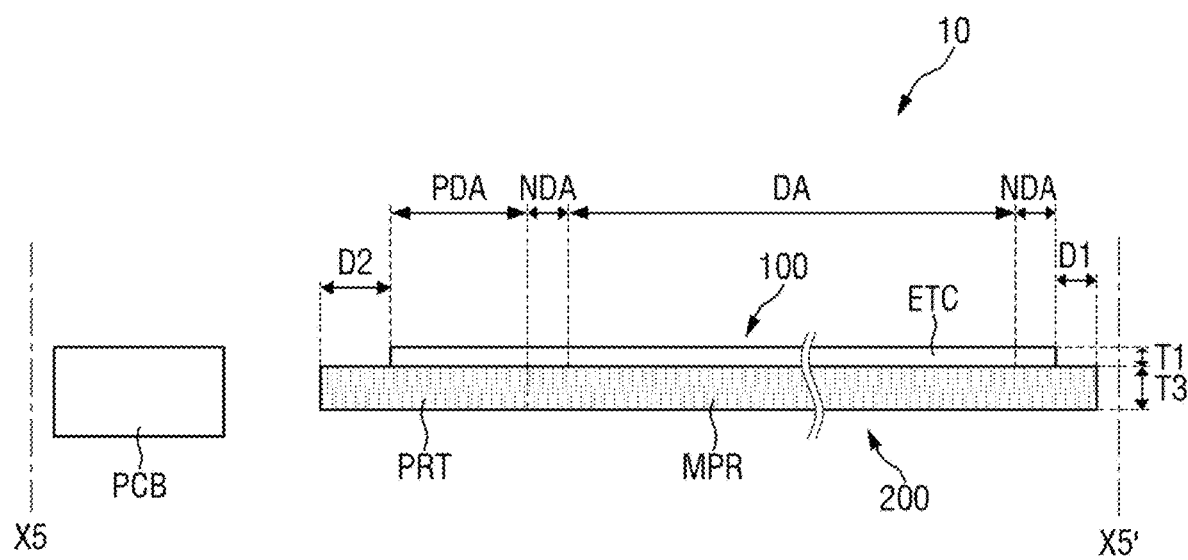
FIG. 16 is a cross-sectional view taken along the line X5-X5' of FIG. 13.

FIG. 13 is a plan view of a display device according to an embodiment of the present disclosure. FIG. 14 is a cross-sectional view taken along the line X3-X3' of FIG. 13. FIG. 15 is a cross-sectional view taken along the line X4-X4' of FIG. 13. FIG. 16 is a cross-sectional view taken along the line X5-X5' of FIG. 13.

Referring to FIGS. 13 through 16, the support member 200 may be bonded onto the bottom surface BS of the display panel 100. First end portions of the connection films COF may be mounted on the wire pads WPD, which are disposed on the pad area PDA of the display panel 100. The driver chips DIC may be mounted in the middle parts of the connection films COF, and the circuit boards PCB may be mounted on second ends of the connection films COF.

As illustrated in FIG. 15, part of the bottom surface portion ETC of the substrate 110 may overlap with the display area DA and the non-display area NDA in the third direction DR3. As illustrated in FIG. 16, another part of the bottom surface portion ETC of the substrate 110 may extend into the pad area PDA, and may overlap with the pad area PDA in the third direction DR3.

The stepped portions NETC of the substrate 110 may overlap with the pad area PDA in the third direction DR3. The wire pads WPD may be disposed on the stepped portions NETC of the substrate 110.

As illustrated in FIGS. 15 and 16, the main portion MPR of the support member 200 may overlap with the display area DA and the non-display area NDA in the third direction DR3. As illustrated in FIG. 15, the depression portions DPR of the support member 200 may overlap with the pad area PDA in the third direction DR3. As illustrated in FIG. 16, the protrusion portions PRT of the support member 200 may overlap with the pad area PDA in the third direction DR3.

As illustrated in FIGS. 14 through 16, the stepped portions NETC of the substrate 110 may overlap with the depression portions DPR of the support member 200 in the third direction DR3, and the bottom surface portion ETC of the substrate 110 may overlap with the protrusion portions PRT of the support member 200 in the third direction DR3. The stepped portions NETC of the substrate 110 and the depression portions DPR of the support member 200 may overlap with the wire pads WPD and the connection films COF.

A thickness T1 of the bottom surface portion ETC of the substrate 110 may be less than a thickness T2 of the stepped portions NETC of the substrate 110. A thickness T3 of the protrusion portions PRT of the support member 200 may be less than the thickness T2 of the stepped portions NETC of the substrate 110. The thickness T2 of the stepped portions NETC of the substrate 110 may be the same as the sum of the thickness T1 of the bottom surface portion ETC of the substrate 110 and the thickness T3 of the protrusion portions PRT of the support member 200. Accordingly, as illustrated in FIG. 15, the bottom surfaces of the substrate 110 and the support member 200 may be aligned or substantially aligned with each other horizontally in the first and second directions DR1 and DR2.

The display device 10 may include the stepped portions NETC for preventing or substantially preventing damage to the substrate 110 during the bonding of the external devices, such as the connection films COF. Because the display device 10 includes the protrusion portions PRT and the depression portions DPR in the support member 200, the step formed by the stepped portions NETC may be compensated for and leveled. Consequently, a roll-based lamination process, such as roll-to-roll and roll-to-stage kind of processes, can be employed to bond the display panel 100 and the support member 200, and thus, leading to enhanced process efficiency and yield.

The support member 200 may have a larger size than that of the display panel 100 in a plan view. For example, as illustrated in FIGS. 15 and 16, one end of the support member 200 may protrude beyond a corresponding end of the substrate 110 in the second direction DR2 by a first length D1. Another end (e.g., an opposite end) of the support member 200 may protrude beyond a corresponding end of the substrate 110 in the second direction DR2 by a second length D2. The length of the protrusion portions PRT may be greater than the length of the stepped portions NETC in the second direction DR2. Accordingly, a space for accommodating a coupling portion for coupling the external devices may be additionally secured.

Various display devices according to some embodiments of the present disclosure will be described in more detail hereinafter. In the following, the same reference numerals are used to denote the same or substantially the same (or similar) elements as those described above, and thus, redundant description thereof may not be repeated or may be simplified, and the differences may be mainly described hereinafter.

Figure 17:
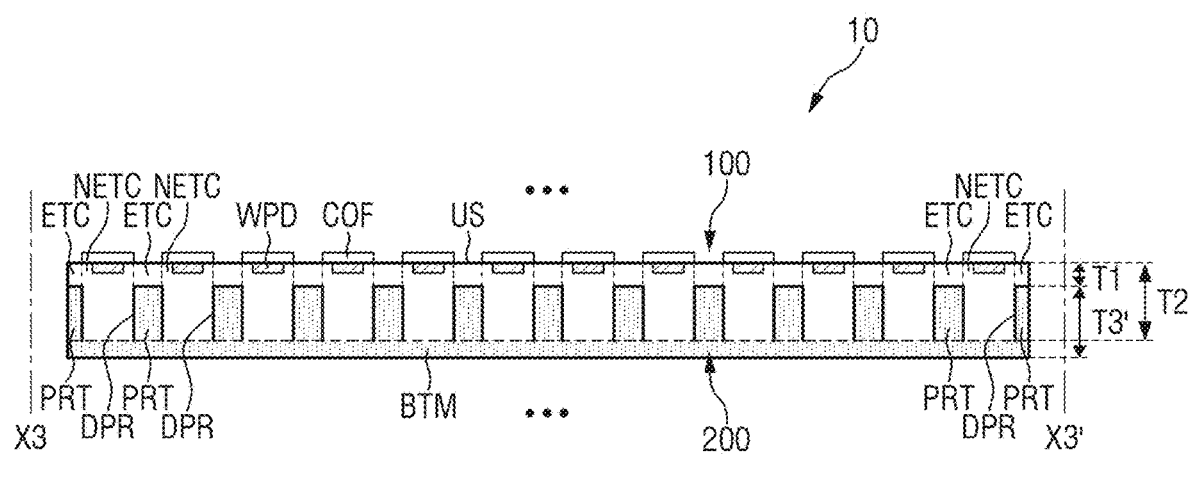
FIGS. 17 through 19 are cross-sectional views of display devices according to some embodiments of the present disclosure.
Figure 18:
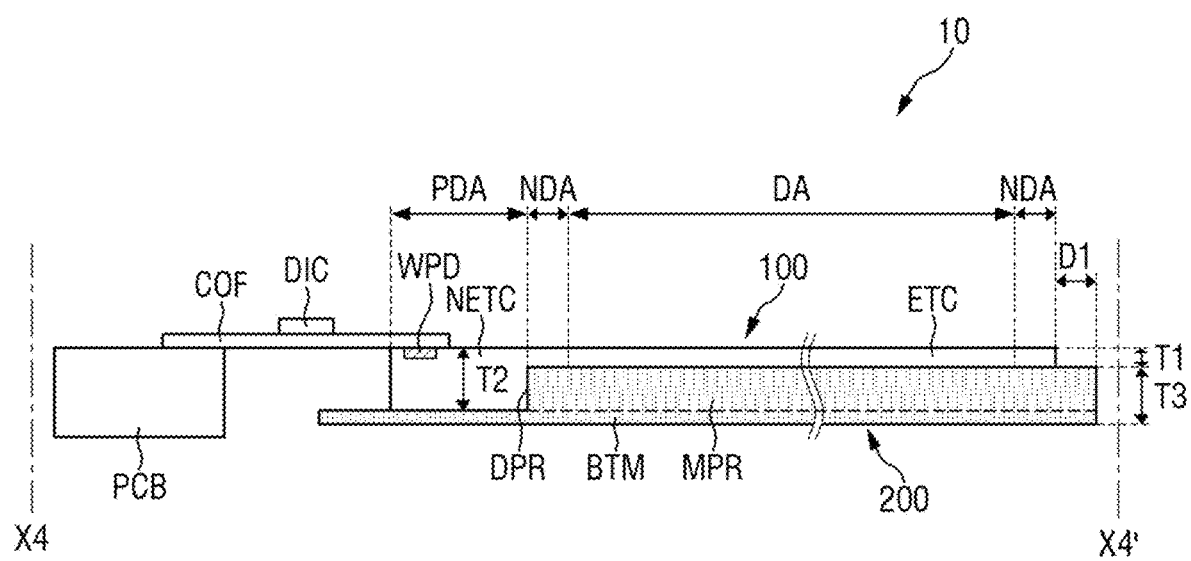
Figure 19:
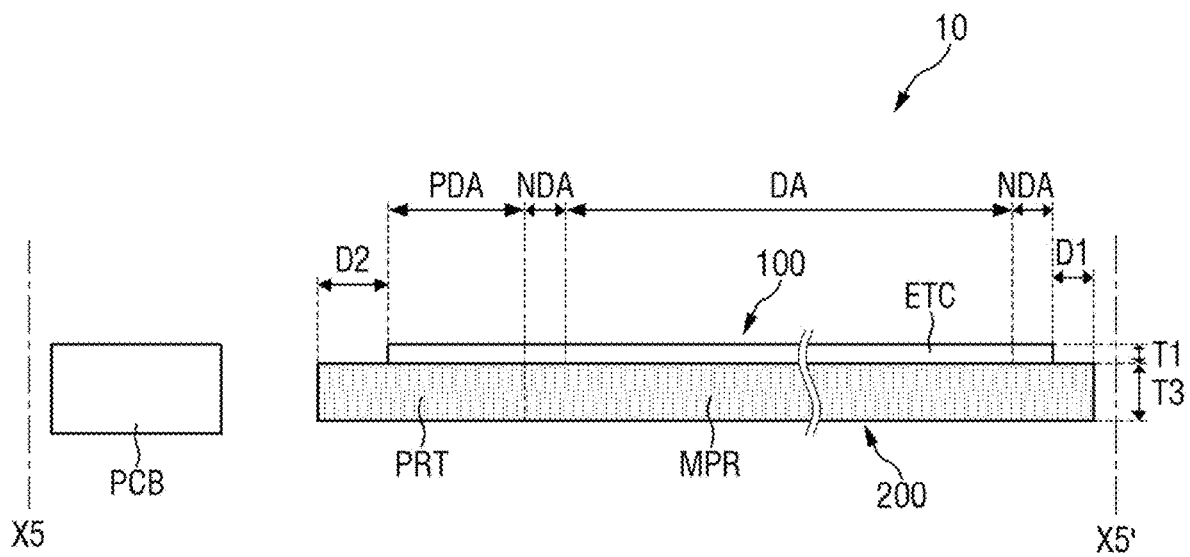

FIGS. 17 through 19 are cross-sectional views of display devices according to some embodiments of the present disclosure.

A display device 10 illustrated in FIGS. 17 through 19 may be different from the display device 10 described above with reference to FIG. 15, in that a support member 200 may further include a lower end portion BTM.

In more detail, the support member 200 may include a main portion MPR, depression portions DPR, and protrusion portions PRT, but may further include the lower end portion BTM. The lower end portion BTM may be disposed below the main portion MPR, the depression portions DPR, and the protrusion portions PRT.

The lower end portion BTM may overlap with the main portion MPR, the depression portions DPR, and the protrusion portions PRT in a third direction DR3. The lower end portion BTM may be disposed on the entire or substantially entire surface of the support member 200. The lower end portion BTM may overlap with the stepped portions NETC and the bottom surface portion ETC of the substrate 110 in the third direction DR3. The bottom surface of the lower end portion BTM may be flat or substantially flat.

The sum of a thickness T3' of the support member 200, including the lower end portion BTM, and a thickness T1 of the bottom surface portion ETC of the substrate 110 may be greater than a thickness T2 of the stepped portions NETC of the substrate 110. Even if the sum of the thickness T3' of the support member 200 and the thickness T1 of the lower end portion ETC of the substrate 110 is greater than the thickness T2 of the stepped portions NETC of the substrate 110, the bottom surface of the display device 10 may be generally flat due to the flat or substantially flat bottom surface of the lower end portion BTM.

Because the display device 10 includes the protrusion portions PRT, the depression portions DPR, and the lower end portion BTM in the support member 200, similar to its counterparts described above, the step formed by the stepped portions NETC of the substrate 110 may be compensated for and leveled. Consequently, a roll-based lamination process, such as roll-to-roll and roll-to-stage kind of processes, may be employed to bond the display panel 100 and the support member 200 to each other, leading to enhanced process efficiency and yield.

Figure 20:
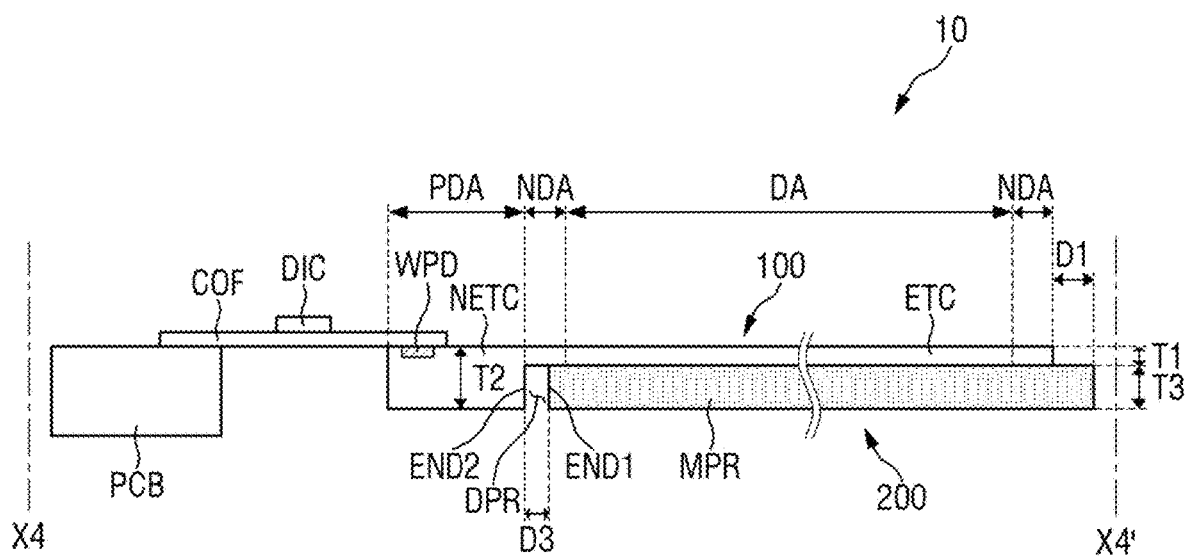
FIG. 20 is a cross-sectional view of a display device according to an embodiment of the present disclosure.
Figure 20:
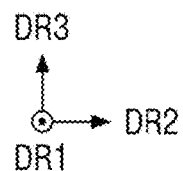

FIG. 20 is a cross-sectional view of a display device according to an embodiment of the present disclosure.

A display device 10 illustrated in FIG. 20 may be different from the display device illustrated in FIG. 10, in that the sides of the main portion MPR of a support member 200 may not be in contact with the sides of the stepped portions NETC of a substrate 110.

In more detail, the size of depression portions DPR of the support member 200 may be greater than the size of the stepped portions NETC of the substrate 110 in the second direction DR2. Accordingly, a second-end portion END1 of the main portion MPR of the support member 200 may be spaced apart from first-end portions END2 of the stepped portions NETC of the substrate 110 by a third length D3. In other words, the sides of the main portion MPR of the support member 200 may not be in contact with the sides of the stepped portions NETC of the substrate 110.

Accordingly, the display device 10 may enhance the accuracy of an attachment process by ensuring an attachment tolerance between a display panel 100 and the support member 200.

The foregoing is illustrative of some embodiments of the present disclosure, and is not to be construed as limiting thereof. Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
   a display panel comprising:
      a substrate;
      a light-emitting layer on a first surface of the substrate; and
      wire pads on the first surface of the substrate, and adjacent to a side of the substrate; and a support member on a second surface of the substrate opposite to the first surface of the substrate, wherein the substrate comprises stepped portions protruding from the second surface in a thickness direction of the substrate, wherein the stepped portions overlap with the wire pads, wherein the support member comprises:
  a main portion overlapping with the light-emitting layer; and
  protrusion portions protruding from the main portion in a direction toward the stepped portions of the substrate, and wherein the support member has a larger size than that of the display panel in an extension direction of the protrusion portions.

2. The display device of claim 1, wherein:
the substrate further comprises a bottom surface portion on the entirety of the second surface except for the stepped portions; and
the bottom surface portion does not overlap with the wire pads.

3. The display device of claim 2, wherein a thickness of the bottom surface portion is less than a thickness of the stepped portions.

4. The display device of claim 3, wherein the bottom surface portion is an etched part of the substrate.

5. The display device of claim 1, wherein:
the stepped portions comprise a plurality of stepped portions;
the protrusion portions comprise a plurality of protrusion portions; and
the plurality of stepped portions and the plurality of protrusion portions are alternately located.

6. The display device of claim 1, wherein:
the substrate further comprises a bottom surface portion on the entirety of the second surface except for the stepped portions; and
the bottom surface portion overlaps with the protrusion portions of the support member.

7. The display device of claim 6, wherein a sum of thicknesses of the bottom surface portion and the support member is greater than or the same as a thickness of the stepped portions.

8. The display device of claim 1, wherein a length of the protrusion portions is greater than a length of the stepped portions in the extension direction of the protrusion portions.

9. The display device of claim 1, wherein:
the support member further comprises a lower end portion below the main portion and the protrusion portions; and
the lower end portion overlaps with the stepped portions and a bottom surface portion.

10. The display device of claim 9, wherein a bottom surface of the lower end portion is flat.

11. The display device of claim 1, wherein sides of the main portion are spaced from sides of the stepped portions.

12. The display device of claim 1, wherein the support member comprises a metal plate.

13. The display device of claim 1, further comprising:
connection films on the wire pads; and
driver chips on the connection films.

14. The display device of claim 13, wherein the stepped portions overlap with the connection films.

15. The display device of claim 1, wherein:
the stepped portions comprise a plurality of stepped portions; and
the plurality of stepped portions are spaced from one another.

16. A rollable electronic device comprising:
a display device comprising:
  a display panel comprising:
    a substrate;
    a light-emitting layer on one surface of the substrate; and
    wire pads on the one surface of the substrate, and adjacent to one side of the substrate; and
  a support member on one surface of the display panel; and
a housing having an inner space in which the display device is configured to be wound or unwound, wherein the substrate comprises stepped portions protruding in a direction toward the support member, wherein the support member comprises protrusion portions protruding in a direction toward the stepped portions, wherein the stepped portions and the protrusion portions are alternately located, and wherein a length of the protrusion portions is greater than a length of the stepped portions in an extension direction of the protrusion portions.

17. The rollable electronic device of claim 16, wherein:
the substrate further comprises a bottom surface portion on the entirety of another surface of the substrate except for the stepped portions; and
a sum of thicknesses of the bottom surface portion and the support member is greater than or the same as a thickness of the stepped portions.

* * * * *